United States Patent [19]

Hatakeyama

[11] Patent Number: 5,295,142
[45] Date of Patent: Mar. 15, 1994

[54] VITERBI DECODER

[75] Inventor: Izumi Hatakeyama, Tokyo, Japan

[73] Assignee: Sony Corporation, Tokyo, Japan

[21] Appl. No.: 533,106

[22] Filed: Jun. 4, 1990

[30] Foreign Application Priority Data

| Jul. 18, 1989 | [JP] | Japan | 1-186380 |
| Jul. 18, 1989 | [JP] | Japan | 1-186381 |
| Jul. 18, 1989 | [JP] | Japan | 1-186382 |
| Jul. 18, 1989 | [JP] | Japan | 1-186383 |

[51] Int. Cl.$^5$ .................................. H03M 13/12
[52] U.S. Cl. ............................................. 371/43
[58] Field of Search ................................ 371/43

[56] References Cited

U.S. PATENT DOCUMENTS

| 4,802,174 | 1/1989 | Hiraiwa et al. | 371/46 |
| 4,905,317 | 2/1990 | Suzuki et al. | 371/43 X |

FOREIGN PATENT DOCUMENTS

| 233788 | 8/1987 | European Pat. Off. | 371/43 |
| 59-019453 | 5/1984 | Japan . | |
| 59-019454 | 5/1984 | Japan . | |
| 77717 | 4/1987 | Japan | 371/43 |

OTHER PUBLICATIONS

Clark, G., et al., *Error-Correction Coding for Digital Communications*, Plenum Press, New York, 1981, pp. 253-265.
Electronics and Communications in Japan 71 (Oct. 1988) No. 10 "Performance of a Viterbi Decoder Using Simplified Digital Metric Calculations," M. Miyake, T. Fujino and K. Fujiwara, pp. 114-123.
IEEE/IEICE Global Telecommunications Conference, 1987, Conference Record vol. 3 of 3, Nov. 15-18, 1987, Tokyo, Japan—Art. "Compression of Path Metrics in Viterbi Decoders," M. Miyake, T. Fujino and K. Fujiwara, pp. 43.2.1-43.2.5.

*Primary Examiner*—Stephen M. Baker
*Attorney, Agent, or Firm*—Limbach & Limbach

[57] ABSTRACT

A Viterbi decoder for decoding a convolution coded reception signal. The Viterbi decoding uses an algorithm for efficiently executing the maximum likelihood decoding using a convolution code by selecting a path locating at the minimum distance from a reception series between two paths which are joined. Since it is necessary to store a state metric of each state, after the state metric of the surviving path was calculated by ACS calculation, it is considered to normalize metrics. However, this results in a large circuit scale and a low processing speed. Therefore, in this invention, a maximum likelihood value of a present state metric is detected from a maximum likelihood branch metric pair before the ACS calculation and the preceding maximum likelihood state metric pair and metrics are normalized by using the maximum likelihood value.

7 Claims, 21 Drawing Sheets

Fig. 10A (1) SM⁻00 、SM⁻01

| SM00 | 000000 | G1 G2 00 | 000000 | SM⁻00 |
|---|---|---|---|---|
| | | 11 | | |
| SM20 | 100000 | 00 | 000001 | SM⁻01 |

(2) SM⁻02 、SM⁻03

| SM01 | 000001 | 10 | 000010 | SM⁻02 |
|---|---|---|---|---|
| | | 01 | | |
| SM21 | 100001 | 10 | 000011 | SM⁻03 |

(3) SM⁻04 、SM⁻05

| SM02 | 000010 | 11 | 000100 | SM⁻04 |
|---|---|---|---|---|
| | | 00 | | |
| SM22 | 100010 | 11 | 000101 | SM⁻05 |

(4) SM⁻06 、SM⁻07

| SM03 | 000011 | 01 | 000110 | SM⁻06 |
|---|---|---|---|---|
| | | 10 | | |
| SM23 | 100011 | 01 | 000111 | SM⁻07 |

(5) SM⁻08 、SM⁻09

| SM04 | 000100 | 11 | 001000 | SM⁻08 |
|---|---|---|---|---|
| | | 00 | | |
| SM24 | 100100 | 11 | 001001 | SM⁻09 |

(6) SM⁻0A 、SM⁻0B

| SM05 | 000101 | 01 | 001010 | SM⁻0A |
|---|---|---|---|---|
| | | 10 | | |
| SM25 | 100101 | 01 | 001011 | SM⁻0B |

Fig. 10B
(7) SM·OC , SM·OD
SM06  000110   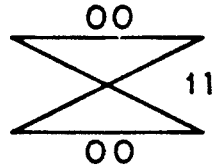   001100  SM·OC
SM26  100110                          001101  SM·OD
(8) SM·OE , SM·OF
SM07  000111   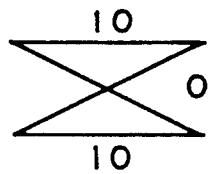   001110  SM·OE
SM27  100111                          001111  SM·OF
(9) SM·10 , SM·11
SM08  001000   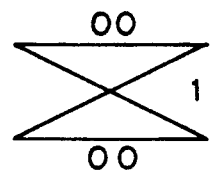   010000  SM·10
SM28  101000                          010001  SM·11
(10) SM·12 , SM·13
SM09  001001   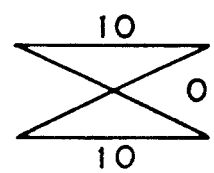   010010  SM·12
SM29  101001                          010011  SM·13
(11) SM·14 , SM·15
SM0A  001010   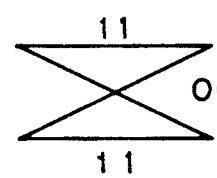   010100  SM·14
SM2A  101010                          010101  SM·15
(12) SM·16 , SM·17
SM0B  001011   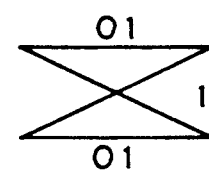  010110  SM·16
SM2B  101011                          010111  SM·17
(13) SM·18 , SM·19
SM0C  001100   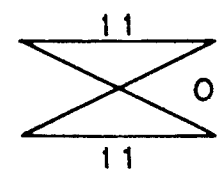  011000  SM·18
SM2C  101100                          011001  SM·19

Fig. 10C
(14) SM⁻1A、SM⁻1B
  SM0D 001101 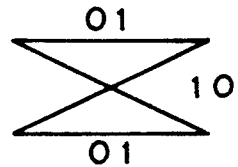 011010 SM⁻1A
  SM2D 101101       011011 SM⁻1B
(15) SM⁻1C、SM⁻1D
  SM0E 001110 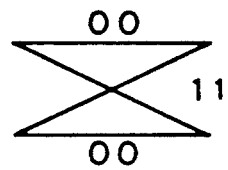 011100 SM⁻1C
  SM2E 101110       011101 SM⁻1D
(16) SM⁻1E、SM⁻1F
  SM0F 001111 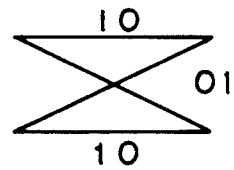 011110 SM⁻1E
  SM2F 101111       011111 SM⁻1F
(17) SM⁻20、SM⁻21
  SM10 010000 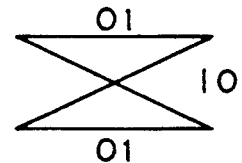 100000 SM⁻20
  SM30 110000       100001 SM⁻21
(18) SM⁻22、SM⁻23
  SM11 010001 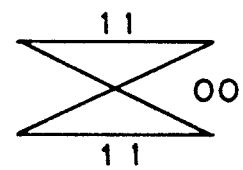 100010 SM⁻22
  SM31 110001       100011 SM⁻23
(19) SM⁻24、SM⁻25
  SM12 010010 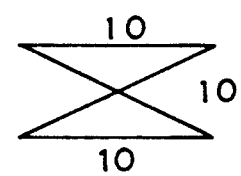 100100 SM⁻24
  SM32 110010       100101 SM⁻25
(20) SM⁻26、SM⁻27
  SM13 010011 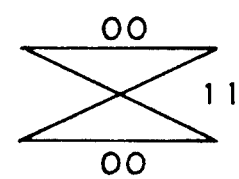 100110 SM⁻26
  SM33 110011       100111 SM⁻27

Fig. 10D
(21) SM·28, SM·29
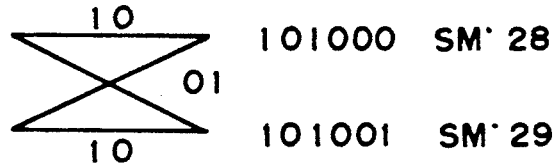
(22) SM·2A, SM·2B
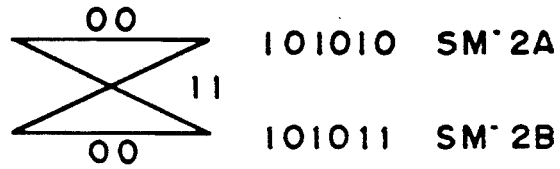
(23) SM·2C, SM·2D
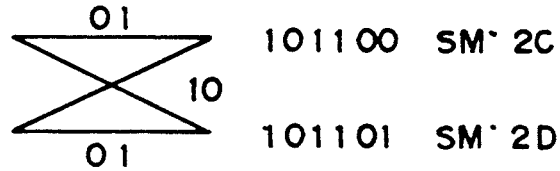
(24) SM·2E, SM·2F
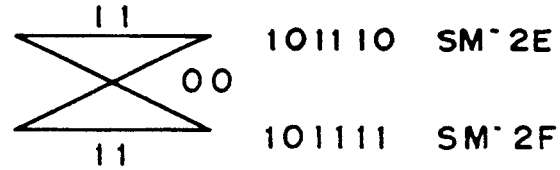
(25) SM·30, SM·31
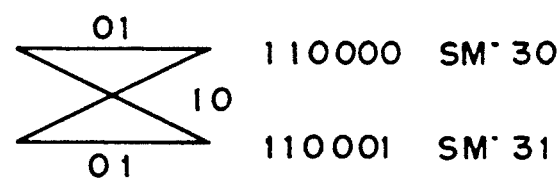
(26) SM·32, SM·33
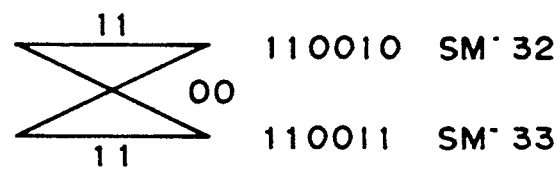
(27) SM·34, SM·35
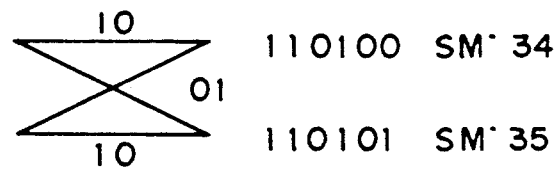

Fig. 10E
(28) SM⁻36、SM⁻37
SM1B  011011  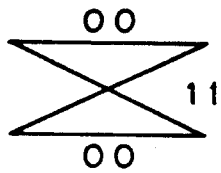  110110  SM⁻38
SM3B  111011           110111  SM⁻37
(29) SM⁻38、SM⁻39
SM1C  011100  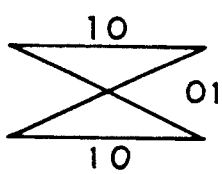  111000  SM⁻38
SM3C  111100           111001  SM⁻39
(30) SM⁻3A、SM⁻3B
SM1D  011101  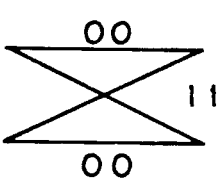  111010  SM⁻3A
SM3D  111101           111011  SM⁻3B
(31) SM⁻3C、SM⁻3D
SM1E  011110  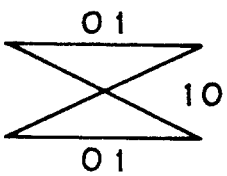  111100  SM⁻3C
SM3E  111110           111101  SM⁻3D
(32) SM⁻3E、SM⁻3F
SM1F  011111  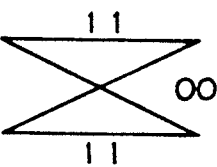  111110  SM⁻3E
SM3F  111111           111111  SM⁻3F

Fig. 13
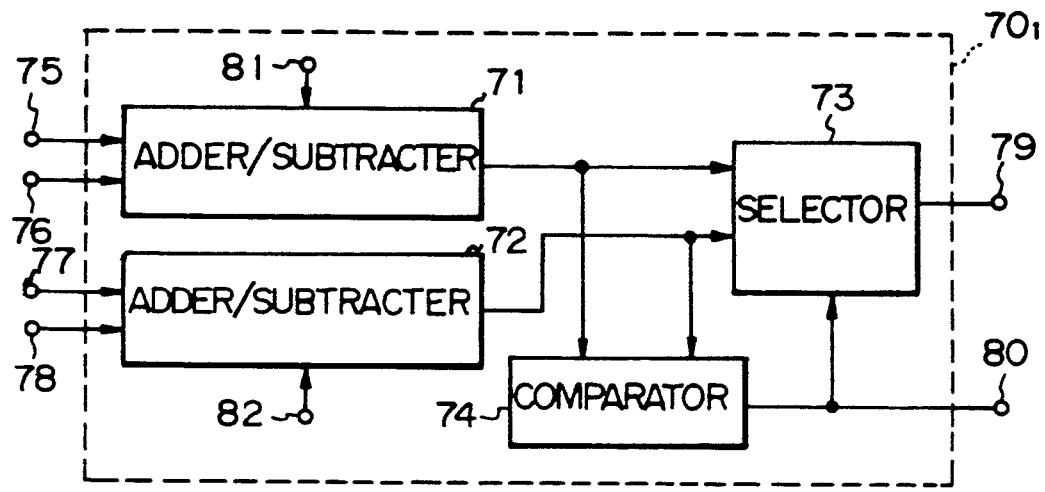
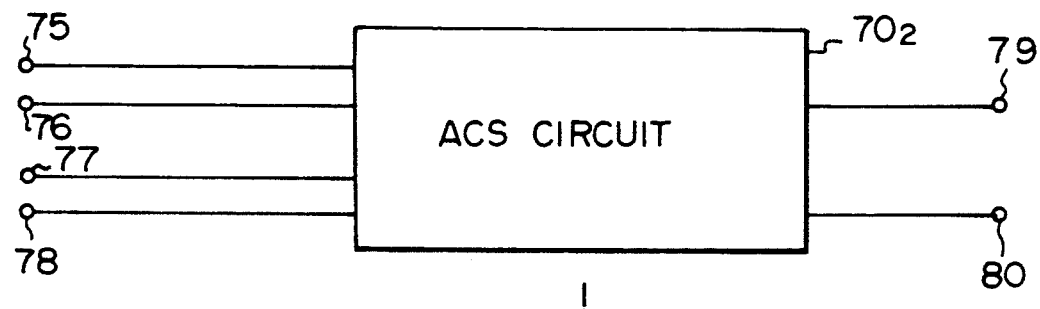
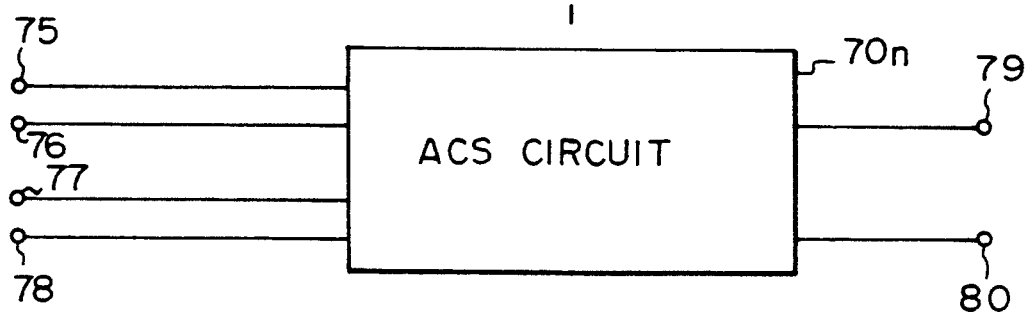

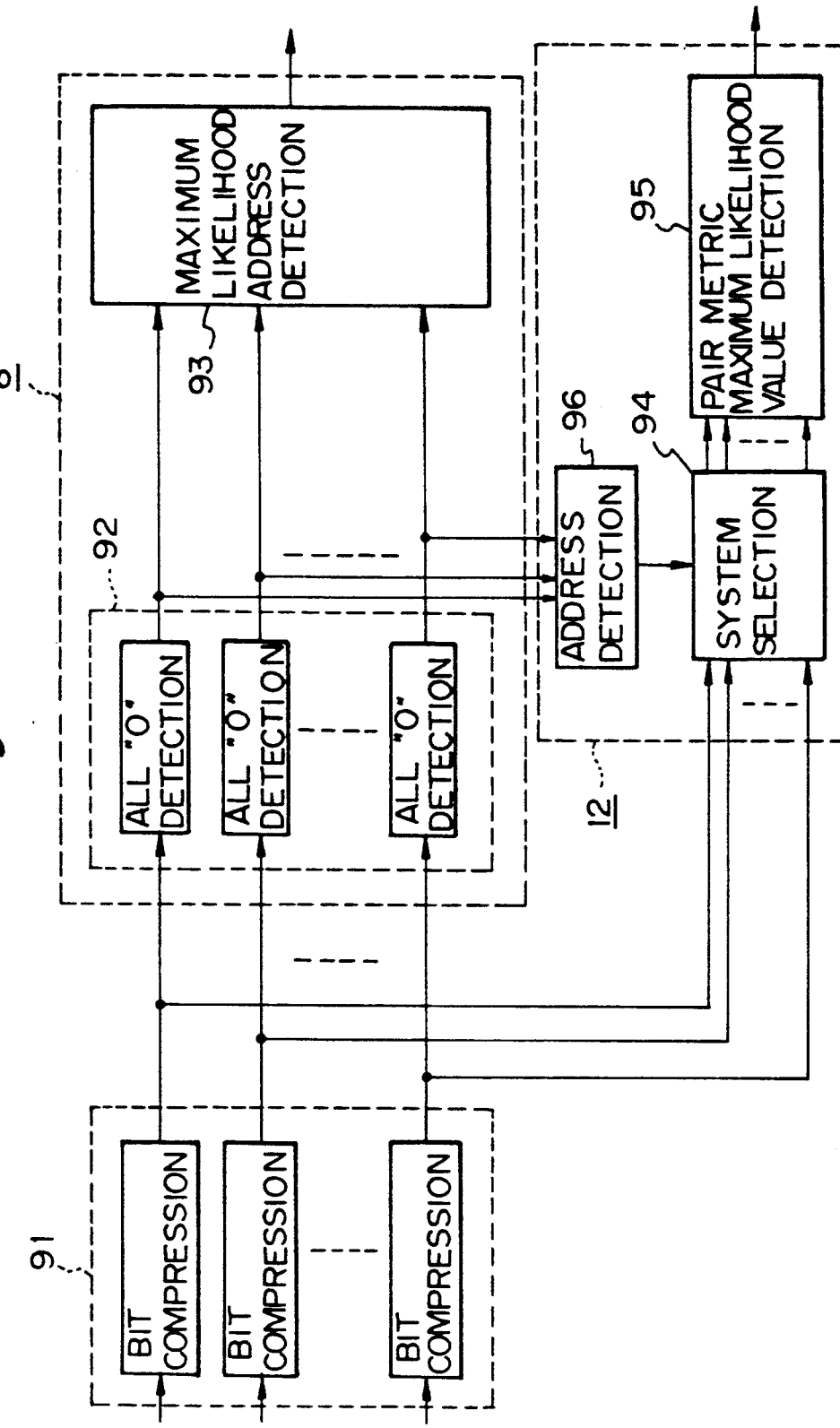

Fig. 17A

| | 1 STEP | 2 STEP | 3 STEP | 4 STEP | 5 STEP | 6 STEP | 7 STEP | 8 STEP |
|---|---|---|---|---|---|---|---|---|
| INPUT BRANCH METRIC | BM00 | BM11 | BM00 | BM00 | BM11 | BM11 | | |
| INPUT STATE METRIC | SM00 | SM02 | SM11 | SM1F | SM1D | SM08 | SM04 | SM0E |
| INPUT BRANCH METRIC | BM11 | BM00 | BM11 | BM00 | | | | |
| INPUT STATE METRIC | SM20 | SM22 | SM31 | SM3F | SM3D | SM28 | SM24 | SM2E |
| OUTPUT STATE METRIC | SM'00 | SM'04 | SM'22 | SM'3F | SM'3B | SM'11 | SM'08 | SM'1D |

| | 9 STEP | 10 STEP | 11 STEP | 12 STEP | 13 STEP | 14 STEP | 15 STEP | 16 STEP |
|---|---|---|---|---|---|---|---|---|
| | BM00 | BM11 | BM00 | BM11 | | | | |
| | SM06 | SM13 | SM15 | SM0A | SM17 | SM1B | SM19 | SM0C |
| | BM11 | BM00 | BM11 | BM00 | | | | |
| | SM26 | SM33 | SM35 | SM2A | SM37 | SM3B | SM39 | SM2C |
| | SM'0C | SM'26 | SM'2A | SM'15 | SM'2E | SM'37 | SM'33 | SM'19 |

Fig. 17B

| | 1 STEP | 2 STEP | 3 STEP | 4 STEP | 5 STEP | 6 STEP | 7 STEP | 8 STEP |
|---|---|---|---|---|---|---|---|---|
| INPUT BRANCH METRIC | BM10 | BM01 | BM10 | BM01 | BM10 | BM01 | BM10 | BM01 |
| INPUT STATE METRIC | SM01 | SM03 | SM10 | SM1E | SM1C | SM09 | SM05 | SM0F |
| INPUT BRANCH METRIC | BM01 | BM10 | BM01 | BM10 | BM01 | BM10 | BM01 | BM10 |
| INPUT STATE METRIC | SM21 | SM23 | SM30 | SM3E | SM3C | SM29 | SM25 | SM2F |
| OUTPUT STATE METRIC | SM'02 | SM'06 | SM'20 | SM'3D | SM'39 | SM'13 | SM'0A | SM'1F |

| 9 STEP | 10 STEP | 11 STEP | 12 STEP | 13 STEP | 14 STEP | 15 STEP | 16 STEP |
|---|---|---|---|---|---|---|---|
| BM10 | | BM01 | | BM10 | | BM01 | |
| SM07 | SM12 | SM14 | SM0B | SM16 | SM1A | SM18 | SM0C |
| BM01 | | BM10 | | BM01 | | BM10 | |
| SM27 | SM32 | SM34 | SM2B | SM36 | SM3A | SM38 | SM2D |
| SM'0E | SM'24 | SM'28 | SM'17 | SM'2C | SM'35 | SM'31 | SM'1B |

Fig. 17C

| | 1 STEP | 2 STEP | 3 STEP | 4 STEP | 5 STEP | 6 STEP | 7 STEP | 8 STEP |
|---|---|---|---|---|---|---|---|---|
| INPUT BRANCH METRIC | BM 01 | BM 10 | BM 10 | BM 01 | BM 10 | | | |
| INPUT STATE METRIC | SM 01 | SM 03 | SM 10 | SM 1E | SM 1C | SM 09 | SM 05 | SM 0F |
| INPUT BRANCH METRIC | BM 10 | BM 01 | BM 10 | BM 01 | | | | |
| INPUT STATE METRIC | SM 21 | SM 33 | SM 30 | SM 3E | SM 3C | SM 29 | SM 25 | SM 2F |
| OUTPUT STATE METRIC | SM' 03 | SM' 07 | SM' 21 | SM' 3C | SM' 38 | SM' 12 | SM' 0B | SM' 1E |

| | 9 STEP | 10 STEP | 11 STEP | 12 STEP | 13 STEP | 14 STEP | 15 STEP | 16 STEP |
|---|---|---|---|---|---|---|---|---|
| | | | BM 01 | | | BM 10 | | BM 01 |
| | SM 07 | SM 12 | SM 14 | SM 0B | SM 16 | SM 1A | SM 18 | SM 0D |
| | | | BM 10 | | | BM 01 | | BM 10 |
| | SM 27 | SM 32 | SM 34 | SM 2B | SM 36 | SM 3A | SM 38 | SM 2D |
| | SM' 0F | SM' 25 | SM' 29 | SM' 16 | SM' 2D | SM' 34 | SM' 30 | SM' 1A |

Fig. 17D

| | 1 STEP | 2 STEP | 3 STEP | 4 STEP | 5 STEP | 6 STEP | 7 STEP | 8 STEP |
|---|---|---|---|---|---|---|---|---|
| INPUT BRANCH METRIC | BM11 | BM00 | | BM11 | | BM00 | | |
| INPUT STATE METRIC | SM00 | SM02 | SM11 | SM1F | SM1D | SM08 | SM04 | SM0E |
| INPUT BRANCH METRIC | BM00 | | BM11 | | BM00 | | BM11 | |
| INPUT STATE METRIC | SM20 | SM22 | SM31 | SM3F | SM3D | SM28 | SM24 | SM2E |
| OUTPUT STATE METRIC | SM'01 | SM'05 | SM'23 | SM'3E | SM'3A | SM'10 | SM'09 | SM'1C |

| | 9 STEP | 10 STEP | 11 STEP | 12 STEP | 13 STEP | 14 STEP | 15 STEP | 16 STEP |
|---|---|---|---|---|---|---|---|---|
| | | BM11 | | BM00 | | BM00 | | BM11 |
| | SM06 | SM13 | SM15 | SM0A | SM17 | SM1B | SM19 | SM0C |
| | | BM00 | | BM11 | | BM11 | | BM00 |
| | SM26 | SM33 | SM35 | SM2A | SM37 | SM3B | SM39 | SM2C |
| | SM'0D | SM'27 | SM'2B | SM'14 | SM'2F | SM'36 | SM'32 | SM'18 |

VITERBI DECODER

BACKGROUND OF THE INVENTION

1. Field of the Invention

The present invention relates to a Viterbi decoder for decoding a convolution code.

2. Description of the Prior Art

A Viterbi decoding is an algorithm in which a path located at the minimum distance from a received series is selected from between two paths which are joined and a maximum likelihood decoding using a convolution code is efficiently executed. According to the Viterbi decoding, a correcting capability for random errors which are generated in a channel is high and if the Viterbi decoding is combined with a soft decision demodulation system, a particularly large coding gain can be obtained. Therefore, in a satellite communication system which is easily influenced by an interference wave and in which an electric power limitation is severe, a convolution code is used as an error correction code and a Viterbi decoder is used for decoding the convolution code. Details of the Viterbi algorithm are described in G. D. Forney. JR.; "The Viterbi Algorithm", PROCEEDING OF THE IEEE, Vol. 61, No. 3, March 1978, pp. 268–278, for instance.

The Viterbi decoding algorithm will be simply described.

For instance, consideration will be made with respect to a convolution code in which generating polynomials are given by $$G_1(D) = 1 + D^2$$

$$G_2(D) = 1 + D + D^2$$

and a coding ratio R is set to $R = \frac{1}{2}$ and a restriction length K is set to $K = 3$. As shown in FIG. 1, an encoder for generating such a code can be constructed by: a shift register comprising registers 151A and 151B; and adders 152A, 152B, and 152C for addition of modulo 2.

As states ($b_1$ $b_2$) of the shift register in such an encoder, four states of (00), (01), (10), and (11) can be used. The number of states which can cause a transition when an input is given is always set to two.

That is, in the case of the state (00), when the input is set to 0, a transition to the state (00) occurs and when the input is set to 1, a transition to the state (01) occurs. In the case of the state (01), when the input is set to 0, a transition to the state (10) occurs and when the input is set to 1, a transition to the state (11) occurs. In the case of the state (10) when the input is set to 0, a transition to the state (00) occurs and when the input is set to 1, a transition to the state (01) occurs. In the case of the state (11) when the input is set to 0, a transition to the state (10) occurs and when the input is set to 1, a transition to the state (11) occurs.

Such state transitions are as shown in a trellis diagram of FIG. 2. In FIG. 2, a branch of a solid line denotes the transition by the input 0 and a branch of a broken line denotes the transition by the input 1. A numeral written along the branch denotes a code ($G_1$ $G_2$) which is output when the transition of the branch occurred.

As will be understood from FIG. 2, two paths are certainly joined in each state. According to the Viterbi decoding algorithm, the maximum likelihood path between two paths in each state is selected and, when a surviving path is selected up to a predetermined length, the maximum likelihood path among the paths selected in the respective state is detected, thereby decoding the received code.

The Viterbi decoder for decoding a convolution code on the basis of such a Viterbi algorithm fundamentally comprises: branch metric calculating means for calculating metrics between a reception series and each branch; ACS (Add-Compare-Select) calculating means for selecting a surviving path and calculating a state metric of a surviving path; state metric memory means for storing values of the state metrics in each state; a path memory for storing an estimated output of the selected path; and maximum likelihood deciding means for detecting an address of the maximum likelihood state metric and controlling the path memory.

In such a Viterbi decoder, the sum of the metrics of the selected path is stored into the state metric memory means. Therefore, there is a possibility such that the state metric memory means overflows. The normalization of metrics is executed to prevent the overflow of the state metric memory means as mentioned above.

That is, FIG. 3 shows an example of a conventional Viterbi decoder. In FIG. 3, a reception code which was soft decided to for instance, eight values is supplied to an input terminal 101. The reception code is supplied from the input terminal 101 to branch metric calculating means 102.

Four branch metrics between the reception series and each branch are obtained by the branch metric calculating means 102. The four branch metrics correspond to the likelihoods between the reception code and the codes (00), (01), (10), and (11), respectively.

An output of the branch metric calculating means 102 is supplied to ACS calculating means 103. State metrics which have been obtained until the preceding time are given from state metric memory means 104 to the ACS calculating means 103.

A surviving path in each state is selected by the ACS calculating means 103 in accordance with the state metric transition diagram. The state metric of the surviving path is calculated. The state metric transition diagram is formed on the basis of the trellis diagram.

In the case of using codes shown in a trellis diagram as shown in FIG. 2, state metric transition diagrams as shown in FIGS. 4A and 4B are obtained.

That is, for instance, in the case of the trellis diagram shown in FIG. 2, two kinds of a path which is caused by outputting the code (00) from the state (00) and a path which causes the code (11) from the state (10) are joined in the state (00). Therefore, the present state metric SM00(new) becomes $$\begin{aligned} SM00(\text{new}) &= SM00 + BM00 \\ \text{or} &\quad SM10 + BM11 \end{aligned}$$

On the other hand, two kinds of a path which causes the code (11) from the state (00) and a path which causes the code (00) from the state (10) are joined in the state (01). Therefore, the present state metric SM01(new) becomes $$\begin{aligned} SM01(\text{new}) &= SM00 + BM11 \\ \text{or} &\quad SM10 + BM00 \end{aligned}$$

Two kinds of a path which is caused by outputting the code (01) from the state (01) and a path which causes the code (10) from the state (11) are joined in the state (10). Therefore, the present state metric SM10(new) becomes $$SM10(new) = SM01 + BM01$$
$$\text{or} \quad SM11 + BM10$$

On the other hand, two kinds of a path which causes the code (10) from the state (01) and a path which causes the code (01) from the state (11) are joined in the state (11). Therefore, the present state metric SM11(new) becomes $$SM11(new) = SM01 + BM10$$
$$\text{or} \quad SM11 + BM01$$

On the basis of the above points, as shown in FIGS. 4A and 4B, state metric transition diagrams can be formed.

In FIG. 3, an output of the ACS calculating means 103 is supplied to normalizing means 105 and is also supplied to maximum likelihood value detecting means 106. An output of the normalizing means 105 is supplied to the state metric memory means 104. On the other information signal regarding the selected path is output from the ACS calculating means 103. The information signal is sent to a path memory 107.

The maximum likelihood value detecting means 106 detects the maximum likelihood state metric among the present state metrics which are output from the ACS calculating means 103.

The maximum likelihood state metric is supplied to the normalizing means 105. In the normalizing means 105, the maximum likelihood state metric is subtracted from each of the state metrics. Due to this, the state metrics are normalized, thereby preventing that the state metric memory means 104 overflows.

An output of the maximum likelihood value detecting means 106 is supplied to maximum likelihood deciding means 108. After the surviving path of a predetermined length was selected, the maximum likelihood path in each state is detected by the maximum likelihood deciding means 108. The path memory 107 is controlled by an output of the maximum likelihood deciding means 108 and the reception code is decoded.

In the case of such a construction, since the normalization is executed by using the present maximum likelihood state metric detected by the maximum likelihood value detecting means 106, the value of the maximum likelihood state metric after completion of the normalization can be certainly set to a predetermined value (for instance, 0.)

However, in the conventional Viterbi decoder constructed as mentioned above, the present maximum likelihood state metric is detected by the maximum likelihood value detecting means 106, the state metrics are normalized by using the present maximum likelihood state metric, and after completion of such a normalizing process, a process to store the state metrics into the state metric memory means 104 must be executed. Thus, a long calculating time is needed.

Therefore, a Viterbi decoder in which metrics are normalized by using the preceding maximum likelihood state metric has been proposed. If the preceding maximum likelihood state metric is used, the state metrics can be normalized without waiting for the detecting process of the present maximum likelihood state metric and the processing speed can be improved.

On the other hand, as shown in FIG. 5, there has been proposed a system in which the preceding maximum likelihood state metric is obtained and given to normalizing means 125 provided before an ACS calculating means 123, thereby executing the normalizing process (for instance, Japanese Patent Laid Open Publication No. Sho 59-19454).

That is, in FIG. 5, a reception code is supplied from an input terminal 121 and a branch metric is obtained by branch metric calculating means 122. The branch metric is supplied to the normalizing means 125. The maximum likelihood value of the preceding state metric is supplied from maximum likelihood value memory means 129 to the normalizing means 125.

In the normalizing means 125, the maximum likelihood value of the preceding state metric is subtracted from a branch metric. An output of the normalizing means 125 is supplied to the ACS calculating means 123. An output of state metric memory means 124 is supplied to the ACS calculating means 123. In the ACS calculating means 123, a surviving path in each state is selected in accordance with the state metric transition diagram and the state metric of the surviving path is calculated.

An output of the ACS calculating means 123 is supplied to the state metric memory means 124 and is also supplied to maximum likelihood value detecting means 126. On the other hand, an output of the ACS calculating means 123 is given to a path memory 127.

In the maximum likelihood value detecting means 126, the maximum likelihood value of the state metric is obtained. The state metric is supplied to the maximum likelihood value memory means 129 and is also supplied to maximum likelihood deciding means 128. An output of the maximum likelihood value memory means 129 is supplied to the normalizing means 125. In the normalizing means 125, the metrics are normalized by using the maximum likelihood value of the preceding state metrics stored in the maximum likelihood value memory means 129.

However, if the normalizing process of the state metrics is executed by using the preceding maximum likelihood state metrics, the value of the maximum likelihood state metric after completion of the nomalization is not set to a predetermined value (for example, 0). If the value of the maximum likelihood state metric is always set to a predetermined value (for instance, 0), by searching the state metric of such a value, the address of the state metric can be detected, so that the address of the maximum likelihood state metric can be very easily detected. However, if the value of the maximum likelihood state metric is not set to a predetermined value, it is necessary to execute processes such as to compare the respective state metrics and detect the maximum likelihood state metric.

As mentioned above, if the present maximum likelihood state metric is obtained from an output after completion of the ACS calculation and the state metrics are nomalized by using it, a problem such that a long processing time is needed occurs.

On the other hand, if the normalization is executed by using the maximum likelihood value of the preceding state metric, since the maximum likelihood value is not set to a precetermined value, there occur problems such that the precesses to detect the maximum likelihood state metric and its address become complicated and the circuit scale increases.

OBJECTS AND SUMMARY OF THE INVENTION

It is an object of the present invention to provide a Viterbi decoder which can reduce the processing time.

Another object of the invention is to provide a Viterbi decoder which can reduce the circuit scale.

According to an aspect of the invention, there is provided a Viterbi decoder for decoding a convolution code comprising:

branch metric calculating means for calculating a branch metric of an input signal;

ACS calculating means for selecting a surviving path and calculating a state metric;

branch metric pair detecting means for detecting a maximum likelihood branch metric pair before ACS calculation from an output of the branch metric calculating means;

state metric pair detecting means for detecting a preceding maximum likelihood state metric pair; and maximum likelihood value detecting means for detecting a maximum likelihood value of a present state metric from the maximum likelihood branch metric pair before the ACS calculation and the preceding maximum likelihood state metric pair, metrics being normalized by using a maximum likelihood value obtained by the maximum likelihood value detecting means.

The transitions include a transition of the series to calculate the preceding state metric and branch metric BM00 or BM11 and a transition of the series to calculate the preceding state metric and the branch metric BM01 or BM10. Therefore, a preceding maximum likelihood state metric pair is obtained from each of the series and either one of the values which are obtained by adding the branch metric pair comprising the maximum likelihood value between the present branch metrics BM00 and BM11 and the maximum likelihood value of the branch metrics BM01 and BM10 to the preceding maximum likelihood state metric pair is set to the maximum likelihood value of the present state metric.

For instance, in the case where state metric transition diagrams are as shown in FIGS. 4A and 4B, FIG. 4A belongs to the series to calculate the preceding state metric and the branch metric BM00 or BM11. FIG. 4B belongs to the series to calculate the preceding state metric and the branch metric BM01 or BM10.

Therefore, in this case, the maximum likelihood value between the state metrics SM00 and SM10 is detected, the maximum likelihood value between the state metrics SM01 and SM11 is detected, and the maximum likelihood state metric pair is detected. The maximum likelihood value between the branch metrics BM00 and BM11 is detected, the maximum likelihood value between the branch metrics BM01 and BM10 is detected, and the branch metric pair is detected.

The maximum likelihood value between the state metrics SM00 and SM10 and the maximum likelihood value between the branch metrics BM00 and BM11 are added. The maximum likelihood value between the state metrics SM01 and SM11 and the maximum likelihood value between the branch metrics BM01 and BM10 are added. Either one of the results of the additions is set to the maximum likelihood value of the present state metric. The metrics before the ACS calculation are normalized by using the maximum likelihood value.

In this case, since the normalization of the metrics can be executed without using the result of the ACS calculation, a surviving path can be immediately selected by the ACS calculating means and the processing time does not become long.

On the other hand, since the normalization can be executed by the present maximum likelihood state metric, the maximum likelihood value of the state metrics is set to a predetermined value (for instance, 0), a construction of the maximum likelihood detecting means can be simplified, and a circuit scale can be reduced.

Since the normalization of the metrics is executed before the ACS calculation, even if the number of states is large, the normalizing circuit does not become complicated.

The above, and other, objects, features and advantages of the present invention will become readily apparent from the following detailed description thereof which is to be read in connection with the accompanying drawings.

BRIEF DESCRIPTION OF THE DRAWINGS

FIGS. 10A to 10E are schematic diagrams showing state metric transition diagrams in an embodiment of the invention;

FIG. 13 is a block diagram of ACS calculating means in an embodiment of the invention;

FIG. 15 is a block diagram of maximum likelihood deciding means and state metric pair maximum likelihood detecting means in an embodiment of the invention;

FIGS. 17A to 17D are schematic diagrams which are used to explain still another embodiment of the invention.

DETAILED DESCRIPTION OF THE PREFERRED EMBODIMENTS

Figure 1:
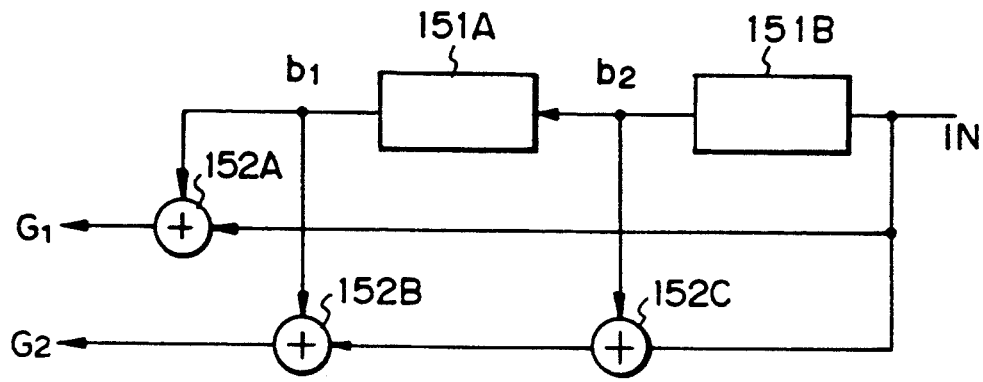
FIG. 1 is a block diagram of an example of an encoder of a convolution code.
Figure 2:
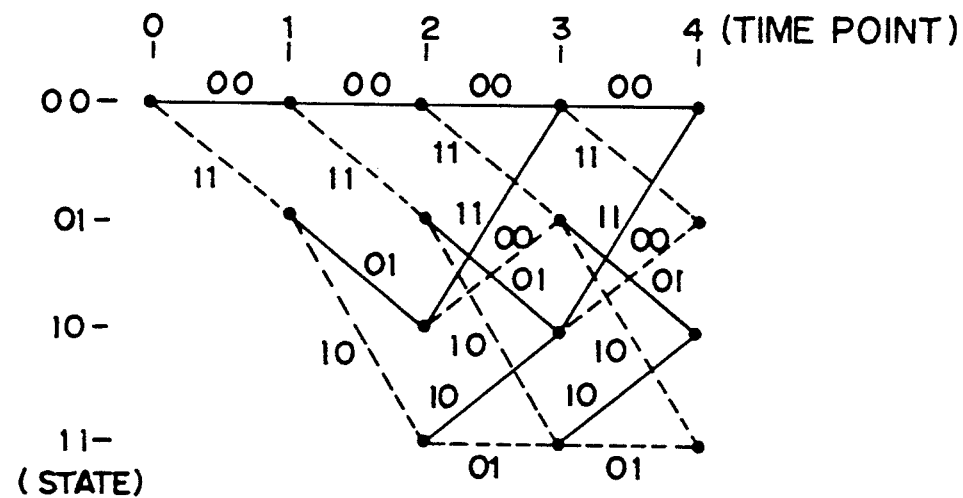
FIG. 2 is a trellis diagram which is used to explain a Viterbi decoder.
Figure 4A:
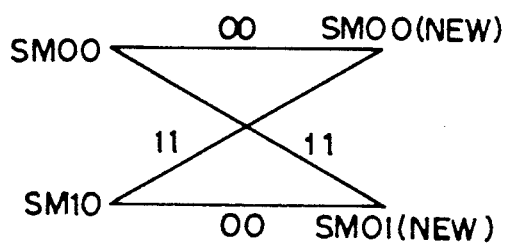
FIGS. 4A and 4B are schematic diagrams showing state metric transition diagrams which are used to explain the Viterbi decoder.
Figure 4B:
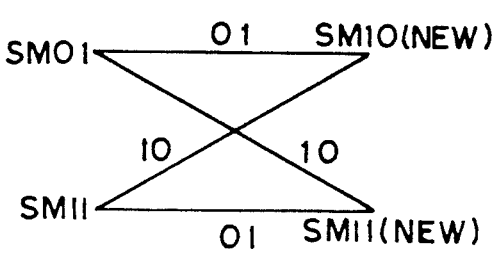
Figure 3:
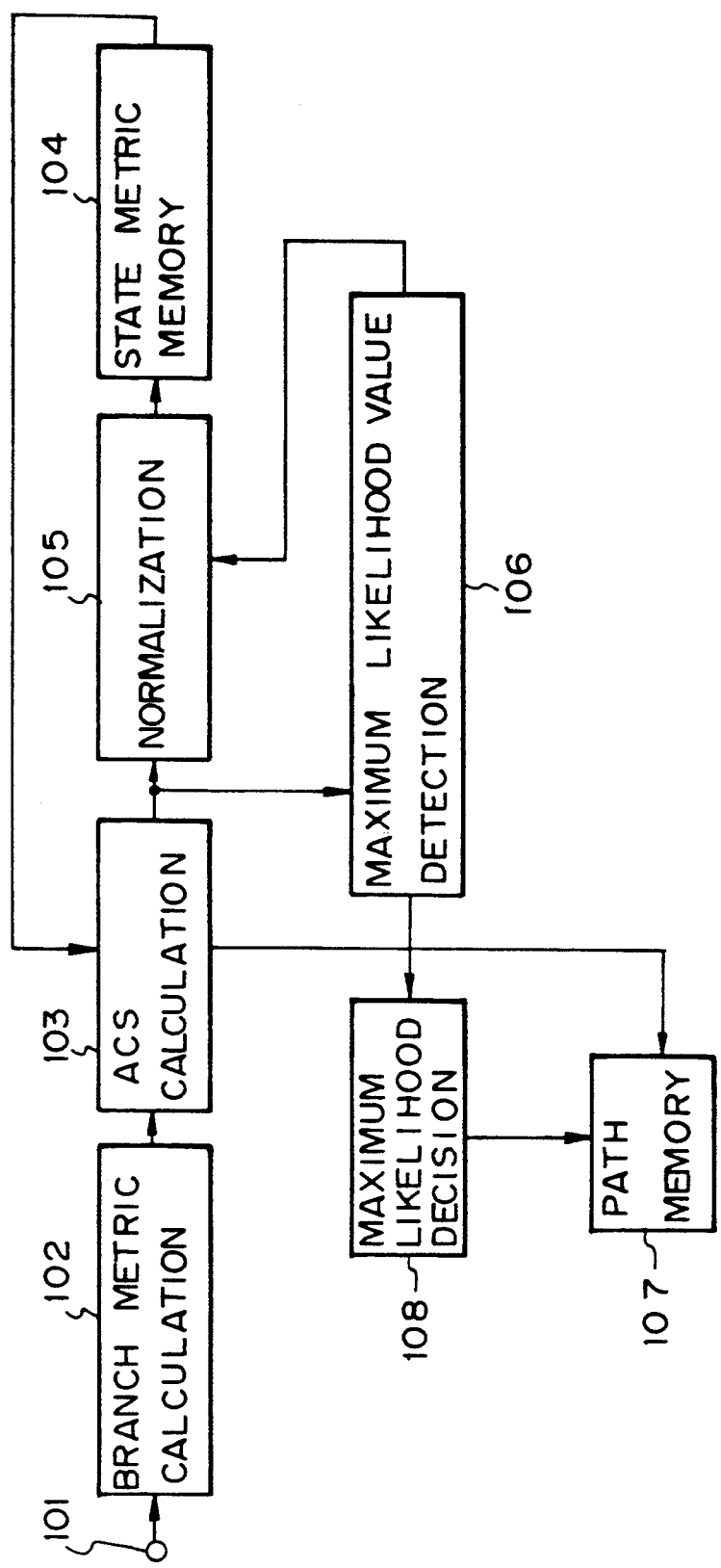
FIG. 3 is a block diagram of an example of the conventional Viterbi decoder.
Figure 5:
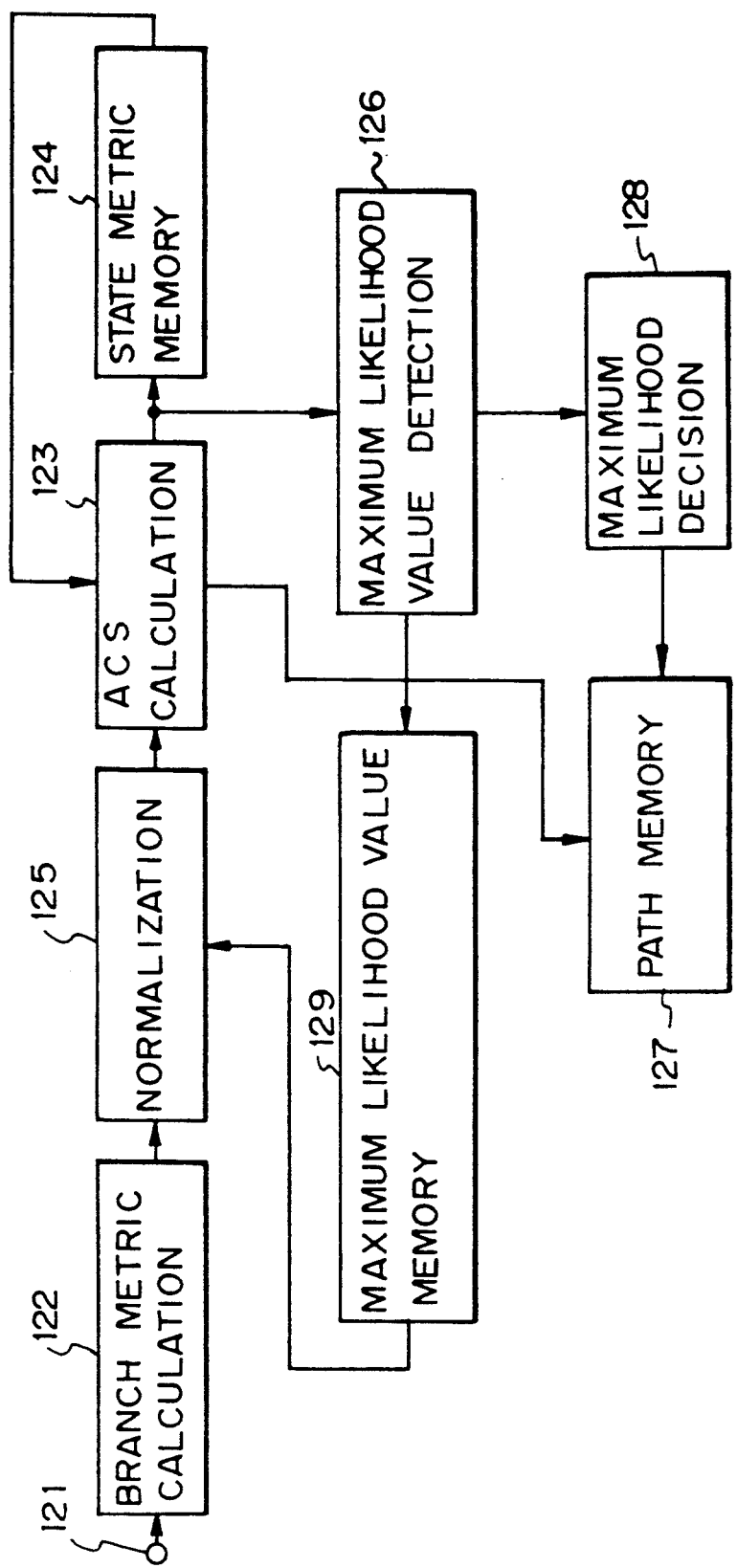
FIG. 5 is a block diagram of another example of a conventional Viterbi decoder.
Figure 6:
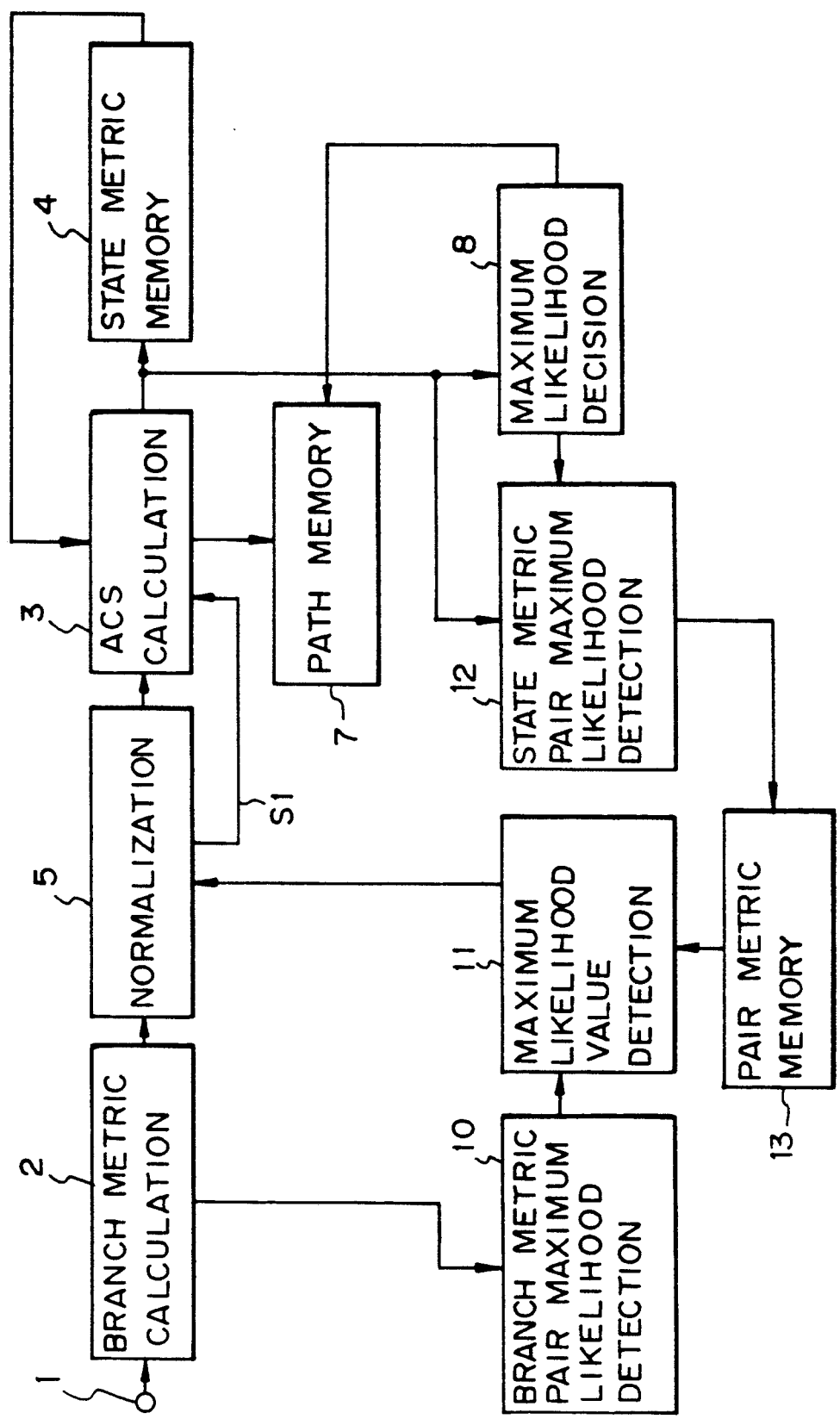
FIG. 6 is a block diagram of an embodiment of the present invention.

FIG. 6 shows a fundamental construction of the invention. In FIG. 6, a reception code which was soft decided to, for instance, eight values is supplied from an input terminal 1. The reception code is supplied to branch metric calculating means 2. In the branch metric calculating means 2, branch metrics are obtained.

The branch metrics obtained by the branch metric calculating means 2 are supplied to normalizing means 5 and also supplied to branch metric pair maximum likelihood detecting means 10.

An output of maximum likelihood value detecting means 11 is supplied to the normalizing means 5. In the maximum likelihood value detecting means 11, as will be explained in detail hereinlater, the present maximum likelihood state metric is obtained from the preceding maximum likelihood state metric pair which are output from state metric pair maximum likelihood detecting means 12 and the present maximum likelihood branch metric pair from an output of the branch metric pair maximum likelihood detecting means 10.

In the normalizing means 5, the output of the maximum likelihood value detecting means 11 is subtracted from each of the branch metrics which are output from the branch metric calculating means 2. Due to this, the metrics are normalized. An output of the normalizing means 5 is supplied to an ACS calculating means 3. On the other hand, an underflow signal (or overflow signal) of the normalizing means 5 is supplied to the ACS calculating means 3 as an addition/subtraction control signal S1 of adders/subtracters constructing the ACS calculating means 3.

The ACS calculating means 3 is constructed by ACS circuits as many as the number of states. Each ACS circuit comprises an adder, a comparator, and a selector. In the embodiment, the adder constructing the ACS circuit has a construction of an adder/subtracter. In the case of a code whose restriction length K is set to 7, the number of states is set to 64. Therefore, the ACS calculating means 3 comprises 64 ACS calculating circuits. On the other hand, a construction of the ACS calculating means 3 can be simplified by executing time sharing processes.

The present branch metric is supplied through the normalizing means 5 to the ACS calculating means 3 and the state metrics until the preceding time are also supplied from state metric memory means 4. In the ACS calculating means 3, the ACS calculation is executed in accordance with a state metric transition diagram. Due to this, a surviving path in each state is selected and the present state metric of the surviving path is calculated.

An output of the ACS calculating means 3 is supplied to the state metric memory means 4 and also supplied to maximum likelihood deciding means 8. An information signal regarding the selected path is output from the ACS calculating means 3. The information signal regarding the selected path is supplied to a path memory 7.

On the other hand, the output of the ACS calculaing means 3 is supplied to the state metric pair maximum likelihood detecting means 12. A preceding maximum likelihood state metric pair is obtained by the state metric pair maximum likelihood detecting means 12. The detection of the maximum likelihood state metric pair will be described in detail hereinlater. The preceding maximum likelihood state metric pair is supplied to the maximum likelihood value detecting means 11 through pair metric memory means 13.

After the surviving path of a predetermined length was selected, the maximum likelihood path in each state is detected by the maximum likelihood deciding means 8. The path memory 7 is controlled by an output of the maximum likelihood deciding means 8 and the reception code is decoded.

In an embodiment of the invention, since the metrics are normalized by the present state metric, the maximum likelihood state metric is always set to 0. Therefore, one of the preceding maximum likelihood state metric pair is set to 0. The maximum likelihood deciding means 8 detects a state metric address in which the state metric is set to 0.

In an embodiment, therefore, the maximum likelihood value of one of the pair state metarics is set to 0 and the maximum likelihood value of the other one of the pair state metrics is obtained by selecting the system by using the output of the maximum likelihood deciding means 8 and by obtaining the maximum likelihood state metric from the system.

Figure 7:
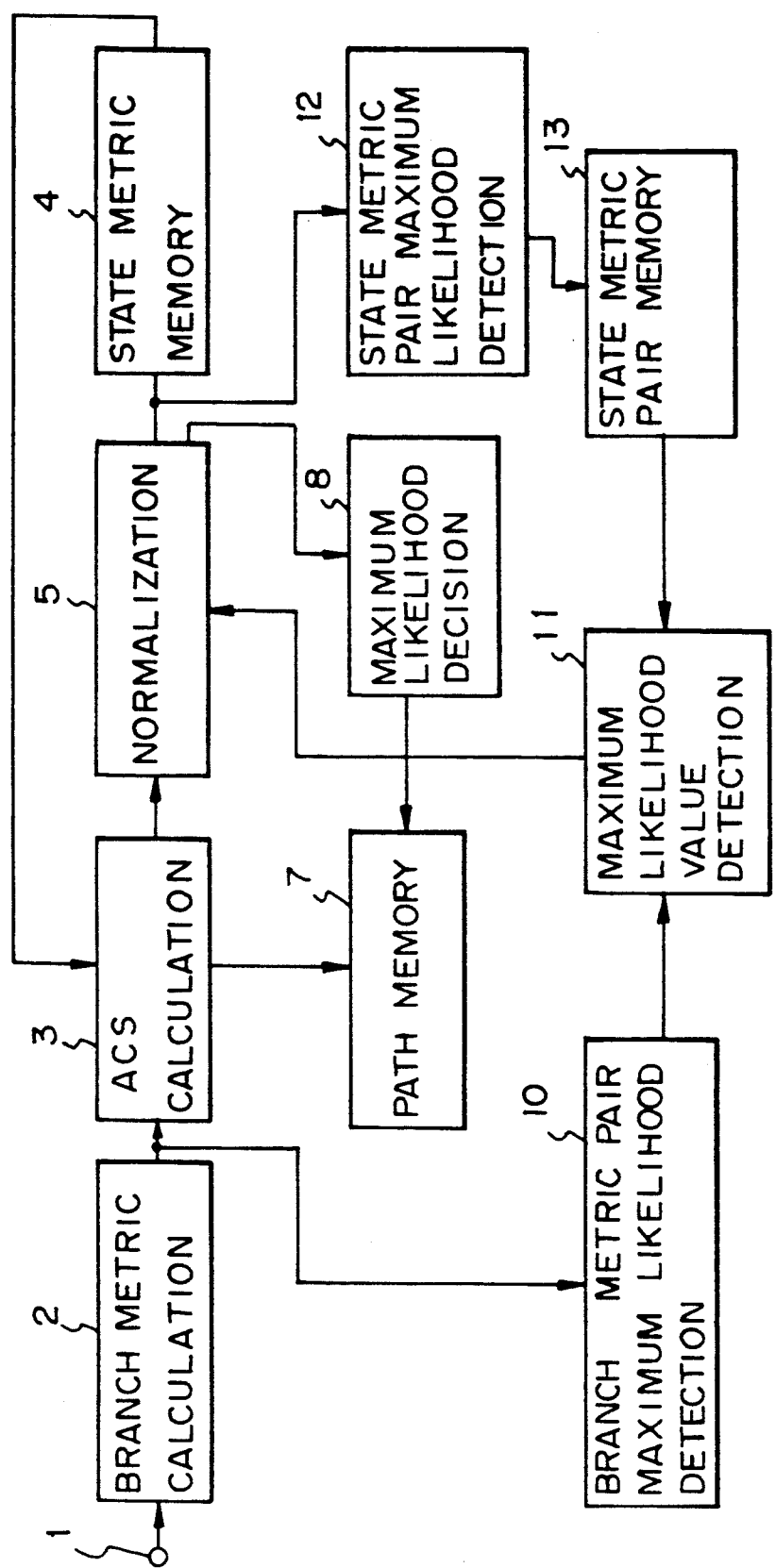
FIGS. 7 to 9 are block diagrams of another embodiments of the invention.

FIG. 7 shows another embodiment of the invention.

The branch metrics obtained by the branch metric calculating means 2 are supplied to the ACS calculating means 3 and also supplied to branch metric pair maximum likelihood detecting means 10.

The present branch metric is supplied from the branch metric calculating means 2 to the ACS calculating means 3 and the state metrics until the preceding time are also supplied from the state metric memory means 4. In the ACS calculating means 3, the ACS calculation is executed in accordance with a state metric transition diagram. Due to this, a surviving path in each state is selected and the present state metric of the surviving path is calculated.

An output of the ACS calculating means is supplied to the normalizing means 5. An output of the normalizing means 5 is supplied to the state metric memory means 4 and also supplied to the maximum likelihood deciding means 8.

Other construction is the same as the one described with regard to FIG. 6.

Figure 8:
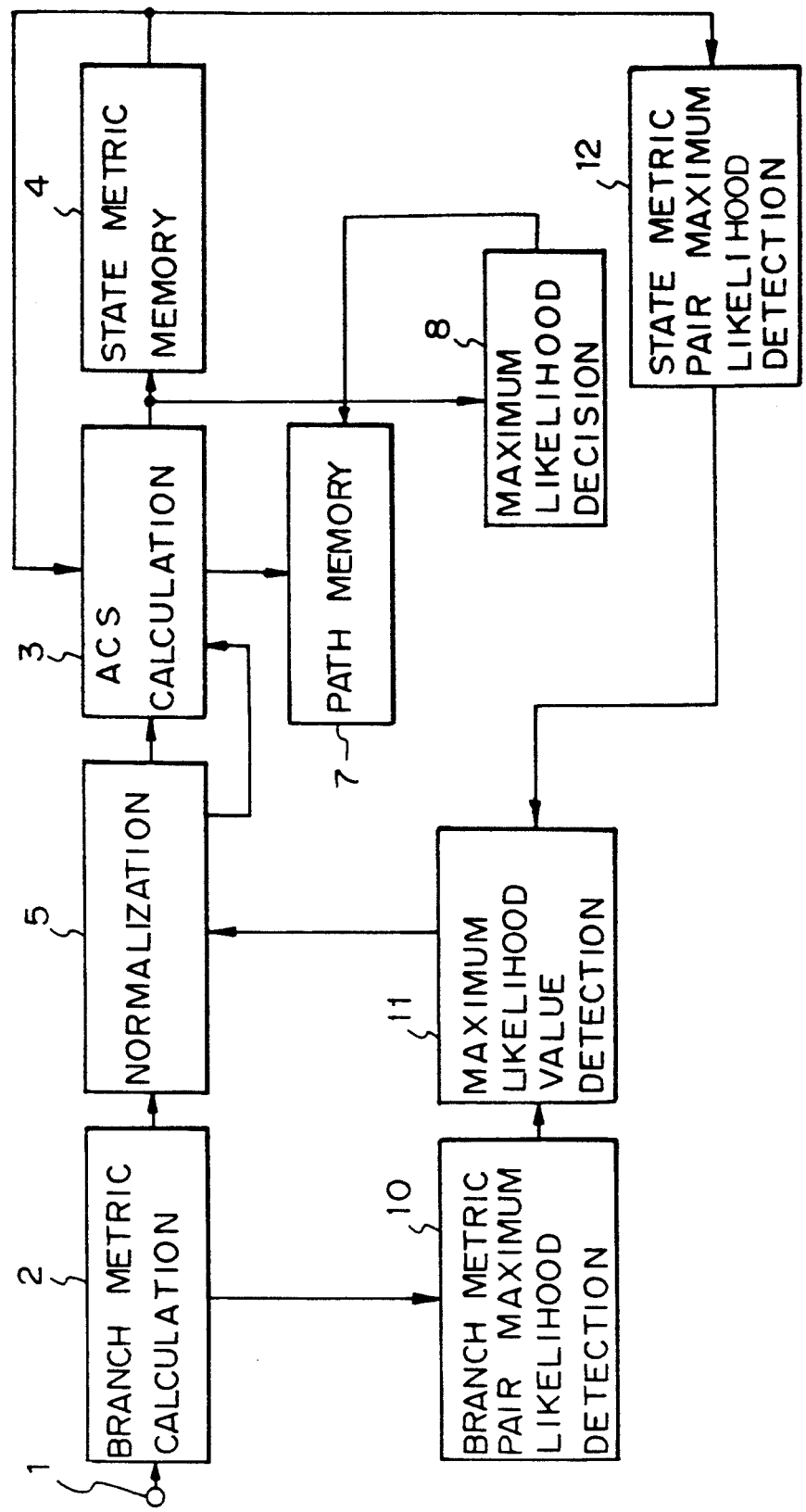
Figure 9:
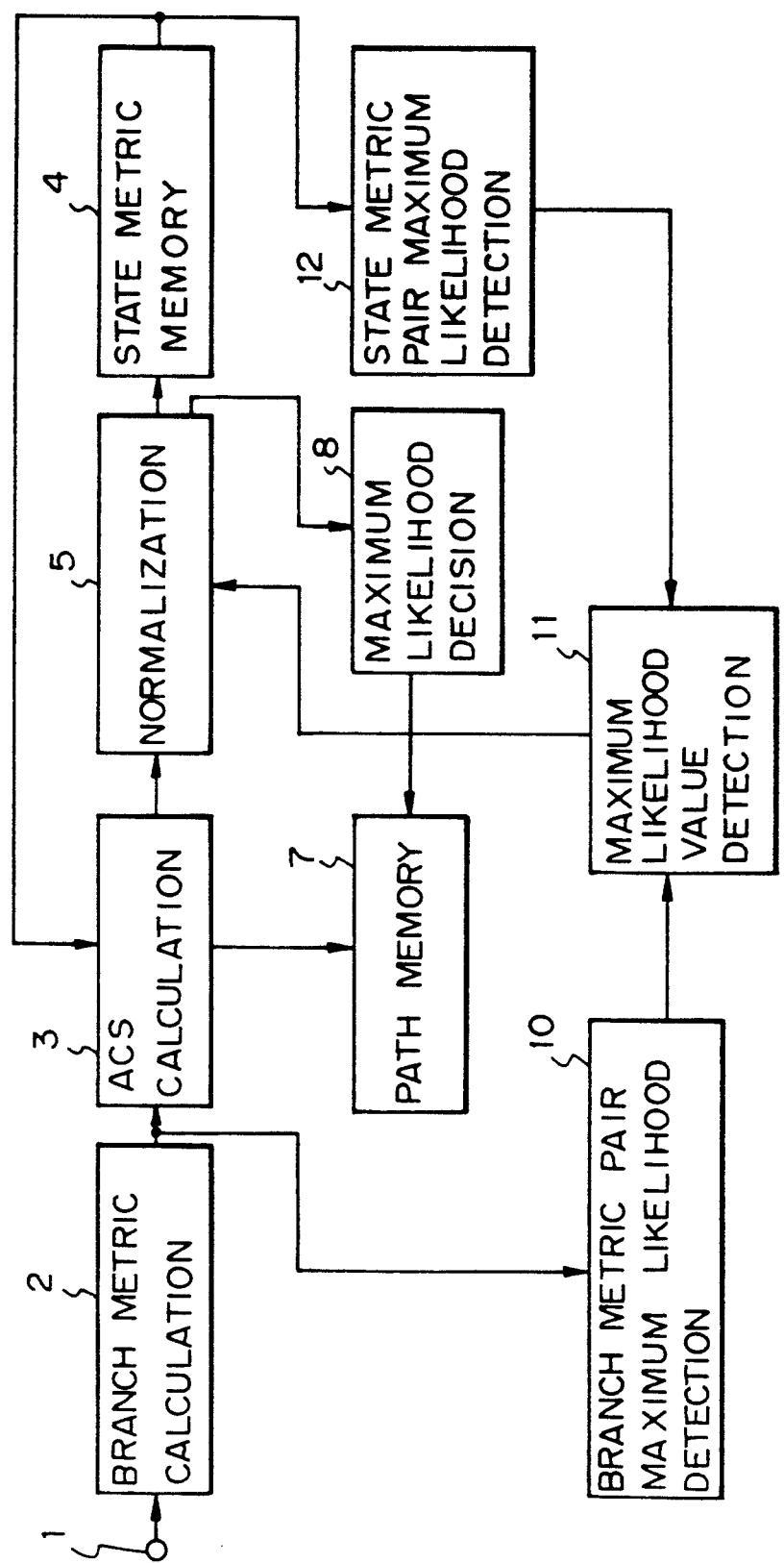

In the above embodiments, although the preceding maximum likelihood state metric pair have been obtained from an output of the ACS calculating means 3 by the state metric pair maximum likelihood detecting means 12, as shown in FIGS. 8 and 9, the preceding maximum likelihood state metric pair can be also obtained from an output of the state metric memory means 4.

Explanation will now be made with respect to a point that in the present maximum likelihood value detecting means 11, the present maximum likelihood state metric is obtained from the present maximum likelihood branch metric pair and the preceding maximum likelihood state metric pair.

The transitions include a transition of the series to calculate the preceding state metric and the branch metric BM00 or BM11 and a transition of the series to calculate the preceding state metric and the branch metric BM01 or BM10.

For instance, FIGS. 10A to 10E are state metric transition diagrams in the case of using a code in which generating polynomials are expressed by $$G_1 = 1 + D + D^2 + D^2 + D^6$$

$$G_2 = 1 + D^2 + D^2 + D^6 + D^6$$

and a restriction length is set to 7 and a coding ratio is set to ½. In FIGS. 10A to 10E, the left side denotes preceding state metrics, the right side indicates present state metrics, the right side of a bit represents the LSB, and the left side indicates the MSB. The address of each state metric is shown by a hexadecimal number and a binary number. As shown in FIGS. 10A to 10E, the transitions (1), (3), (5), ... belong to the series to calculate the preceding state metric and the branch metric BM00 or BM11 and the transitions (2), (4), (6), ... belong to the series to calculate the preceding state metric and the branch metric BM01 or BM10.

By adding the maximum likelihood value of the preceding state metrics SM00, SM20, SM02, SM22, ... which belong to the series to calculate the preceding state metric and the branch metric BM00 or BM11 and the maximum likelihood value between the present branch metrics BM00 and BM11, the maximum likelihood value of the present state metrics which are obtained from such a series is derived.

On the other hand, by adding the maximum likelihood value of the preceding state metrics SM01, SM21, SM03, SM23, ... which belong to the series to calculate the preceding state metric and the branch metric BM01 or BM10 and the maximum likelihood value between the present branch metrics BM01 and BM10, the maximum likelihood value of the present state metrics which are obtained from such a series is derived.

The maximum likelihood value of the present state metric is either one of the maximum likelihood values of the two systems.

In the branch metric pair maximum likelihood detecting means 10, the maximum likelihood value between the branch metrics BM00 and BM11 and the maximum likelihood value between the branch metrics BM01 and BM10 are detected. Thus, a maximum likelihood branch metric pair is obtained.

The preceding maximum likelihood state metric which belongs to the series to calculate the preceding state metric and the branch metric BM00 or BM11 and the preceding maximum likelihood state metric which belongs to the series to calculate the preceding state metric and the branch metric BM01 or BM10 are detected by the state metric pair maximum likelihood detecting means 12. Thus, the preceding maximum likelihood state metric pair is obtained.

The maximum likelihood value of the present state metric is obtained by the maximum likelihood value detecting means 11 from the present maximum likelihood branch metric pair and the preceding state metric pair.

That is, the preceding maximum likelihood state metric which belongs to the series to calculate the preceding state metric and the branch metric BM00 or BM11 and the maximum likelihood branch metric between the branch metrics BM00 and BM11 are added by the maximum likelihood value detecting means 11. On the other hand, the preceding maximum likelihood state metric which belongs to the series to calculate the preceding state metric and the branch metric BM01 or BM10 and the maximum likelihood branch metric between the branch metrics BM01 and BM10 are added. Both of them are compared. Thus, the maximum likelihood value of the present state metric is obtained.

As mentioned above, according to an embodiment of the invention, the normalization of the metrics is executed by the present state metric. Therefore, the normalized maximum likelihood state metric can be certainly set to 0. If the maximum likelihood state metric can be normalized to 0, the address of the maximum likelihood state metric can be very easily detected.

When the normalization is executed by the normalizing means 5 before the ACS calculation as in an embodiments shown in FIGS. 6 and 8, there is a possiblility such that the branch metric after completion of the normalization has a negative value and the subtracter constructing the normalizing means 5 underflows. If such a state occurs, after the ACS calculation, the normalized maximum likelihood state metric is not set to 0.

To prevent such a phenomenon, in the embodiments, each of the adders constructing the ACS calculating means 3 is constructed by an adder/subtracter. An underflow signal of the subtracter constructing the normalizing means 5 is set to an addition/subtraction control signal S1 of the adders/subtracters constructing the ACS calculating means 3. When the subtracter constructing the normalizing means 5 underflows, corresponding one of the adders/subtracters constructing the ACS calculating means 3 is used as a subtracter. Thus, the maximum likelihood state metric after completion of the normalization can be always set to 0.

The branch metric calculating means in the embodiments of the invention will be described in detail.

Figure 11:
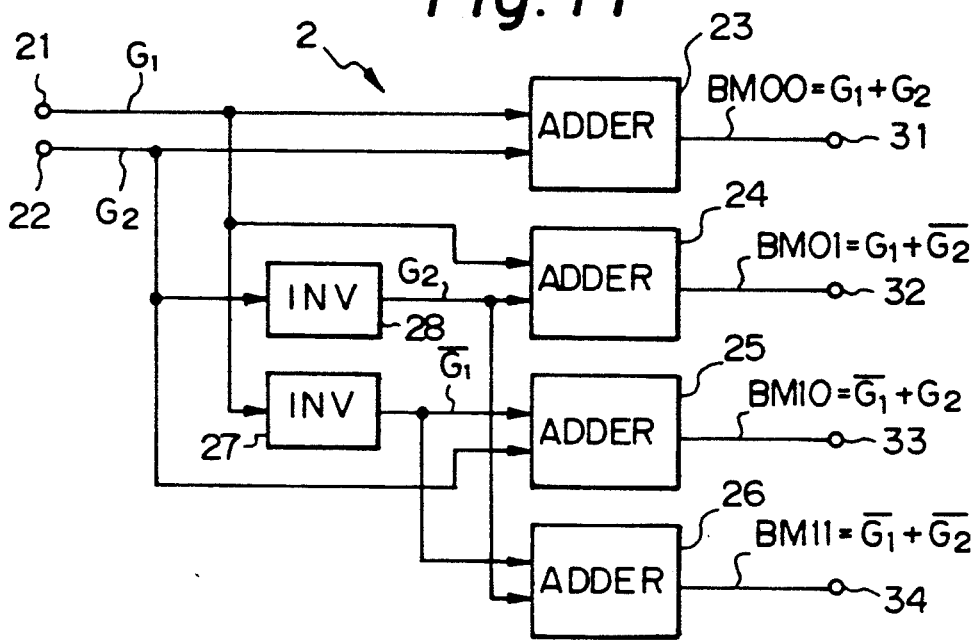
FIG. 11 is a block diagram of branch metric calculating means in an embodiment of the invention.

FIG. 11 shows an example of the branch metric calculating means 2. In FIG. 11, reception codes $G_1$ and $G_2$ which were soft decided to, for instance, eight values are supplied to input terminals 21 and 22. The codes $G_1$ and $G_2$ from the input terminals 21 and 22 are supplied to inverters 27 and 28. The inverters 27 and 28 invert the codes $G_1$ and $G_2$, respectively. A code $\overline{G_1}$ is output from the inverter 27. A code $\overline{G_2}$ is output from the inverter 28.

Assuming that the maximum value of the soft decision data is set to N, $$\overline{G_1} = N - G_1$$

$$\overline{G_2} = N - G_2$$

Adders 23 to 26 are adders of, for instance, four bits. The codes $G_1$ and $G_2$ are supplied to the adder 23. The branch metric $BM00 = G_1 + G_2$ is obtained by the adder 23. The branch metric BM00 is output from an output terminal 31.

The codes $G_1$ and $\overline{G_2}$ are supplied to the adder 24. The branch metric $BM01 = G_1 + \overline{G_2}$ is obtained by the adder 24. The branch metric BM01 is output from an output terminal 32.

The codes $\overline{G_1}$ and $G_2$ are supplied to the adder 25. The branch metric $BM10 = \overline{G_1} + G_2$ is obtained by the adder 25. The branch metric BM10 is output from an output terminal 33.

The codes $\overline{G_1}$ and $\overline{G_2}$ are supplied to the adder 25. The branch metric $BM11 = \overline{G_1} + \overline{G_2}$ is obtained by the adder 26. The branch metric BM11 is output from an output terminal 34.

The branch metrics BM00, BM01, BM10, and BM11 indicate the likelihoods in which the reception codes are (00), (01), (10), and (11), respectively. For instance, as the value is small, a likelihood degree is high.

Figure 12:
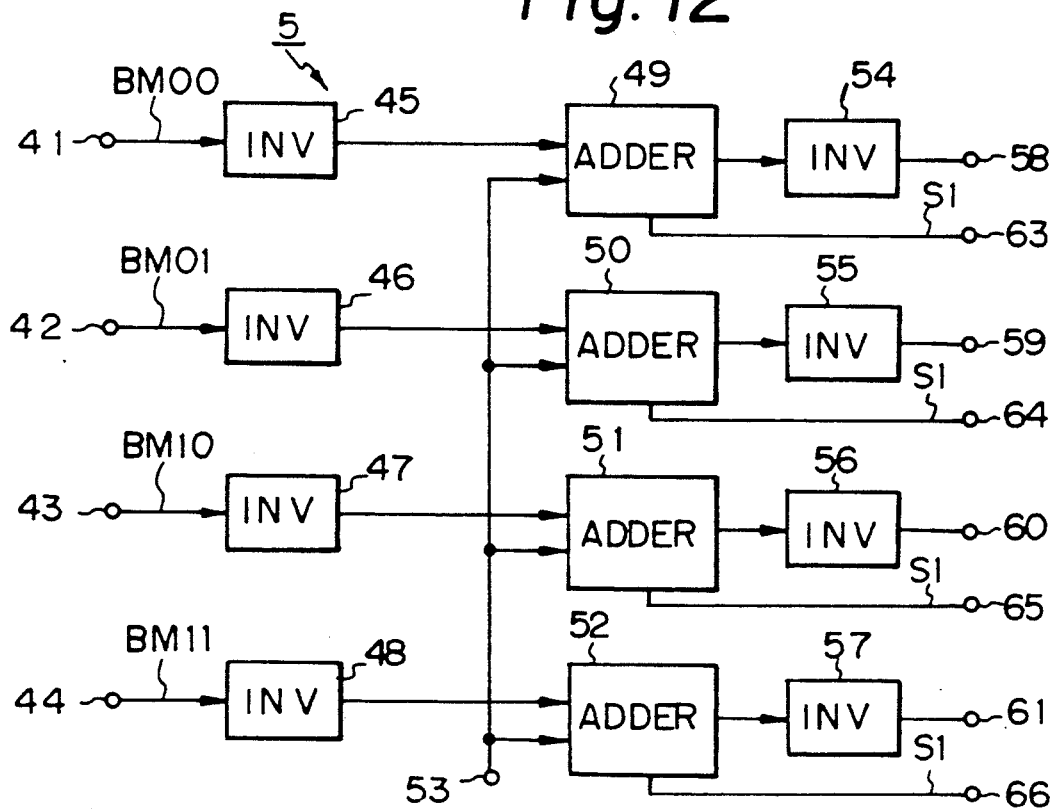
FIG. 12 is a block diagram of normalizing means in an embodiment of the invention.

FIG. 12 shows an example of the normalizing means 5. In FIG. 12, the branch metrics BM00 to BM11 are supplied to input terminals 41 to 44, respectively. The branch metrics BM00 to BM11 are supplied to each one input terminal of adders 49 to 52 through inverters 45 to 48, respectively. The present maximum likelihood state metric is supplied from a terminal 53 to the other input terminals of the adders 49 and 52. The present maximum likelihood state metric is obtained from the preceding maximum likelihood state metric pair and the present maximum likelihood branch metric pair as mentioned above. Outputs of the adders 49 to 52 are output from ouput termianls 58 to 61 through inverters 54 to 57. Overflow signals of the adders 49 to 52 are output from output terminals 63 to 66. The overflow signals are set to addition/subtraction control signals S1 of the adders/subtracters constructing the ACS calculating means 3.

The ACS calculating means 3 comprises ACS circuits $70_1$ to $70_n$ as many as the number of states. FIG. 13 shows a construction of each of the ACS circuits constructing the ACS calculating means 3.

In FIG. 13, the state metrics which have been obtained until the preceding time are supplied from an input terminal 75 to an adder/subtracter 71 and the present branch metric is also supplied from an input trminal 76. The present state metric of one of the paths is obtained by the adder/subtracter 71.

The state metrics which have been obtained until the preceding time are supplied from an input terminal 77 to an adder/subtracter 72 and the present branch metric is also supplied from an input terminal 78. The state metric of the other path is obtained by the adder/subtracter 72.

Outputs of the adders/subtracters 71 and 72 are supplied to a selector 73 and a comparator 74. An output of the comparator 74 is supplied to the selector 73 and the selector 73 is switched in accordance with an output of the comparator 74. Either smaller one of the outputs of the adders/subtracters 71 and 72 is output from an output terminal 79. The output of the comparator 74 is output from a terminal 80 as a selection information signal of the path.

Addition/subtraction switching signals are supplied from terminals 81 and 82 to the adders/subtracters 71 and 72.

In the embodiments of the invention, since the normalization of the metrics is executed by the present maximum likelihood state metric, the maximum likelihood state metric after completion of the normalization is certainly set to 0. Therefore, the maximum likelihood state metric can be very easily detected. Since the normalization of the metrics is executed every time as mentioned above, the obtained state metric is compressed, for instance, from seven bits to three bits and the maximum likelihood state metric can be obtained and the circuit scale can be reduced.

That is, for example, in the case where the 8-value soft decision was executed, the number of bits of the state metric can be expressed by three bits. The present state metric is obtained by adding the preceding state metric to the normalized branch metric. The state metric is normalized so that the maximum likelihood value is set to 0 every step. Therefore, the present maximum likelihood state metric which is output from the ACS calculating means 103 can be regarded to be up to 7 (corresponding to three bits). Thus, the maximum likelihood of the present state metric can be detected by compressing the state metric after completion of the normalization to three bits.

Figure 14:
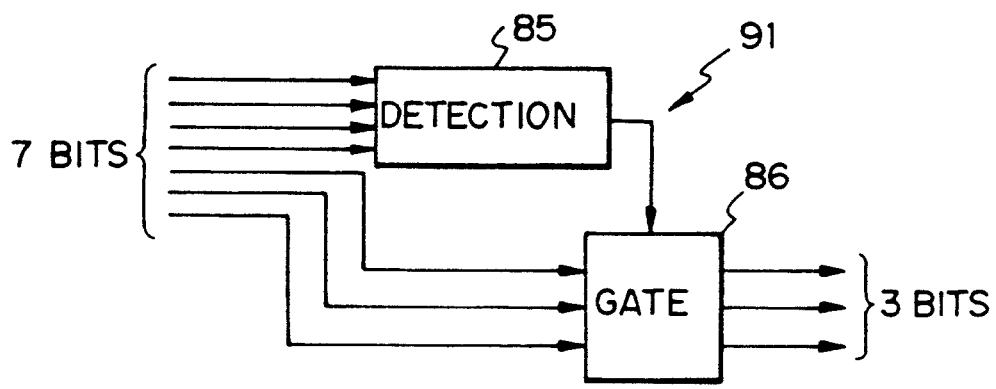
FIG. 14 is a block diagram of bit compressing means in an embodiment of the invention.

FIG. 14 shows an example of bit compressing means. In FIG. 14, upper four bits in the 7-bit state metric which is output from the ACS calculating means 3 are supplied to a deteting circuit 85 and lower three bits are supplied to a gate circuit 86. The detecting circuit 85 detects whether "1" is included in the upper four bits or not.

An output of the detecting circuit 85 is supplied to the gate circuit 86. If "1" is not detected in the upper four bits by the detecting circuit 85, the gate circuit 86 is opened and the data of lower three bits is directly output through the gate circuit 86. If "1" is detected in the upper four bits by the detecting circuit 85, the data of all "1" is output from the gate circuit 86. Thus, the state metric of seven bits is compressed to three bits and output from the gate circuit 86.

On the other hand, since the maximum likelihood value of the state metric is certainly set to 0, one of the maximum likelihood state metric pair is certainly set to 0. Therefore, a system in which the maximum likelihood value is not set to 0 is selected by using the maximum likelihood address obtained by the maximum likelihood deciding means 8. One of the pair metrics is set to 0. The detecting process of the maximum likelihood value is executed with respect to only the system in which the maximum likelihood value is not set to 0. Thus, the maximum likelihood state metric pair can be obtained.

FIG. 15 shows an example of the maximum likelihood deciding means 8 and state metric pair maximum likelihood detecting means 12.

In FIG. 15, each of the state metrics which were compressed to three bits by bit compressing means 91 is supplied to the maximum likelihood deciding means 8 and also supplied to the state metric pair maximum likelihood detecting means 12.

The maximum likelihood deciding means 8 comprises an all "0" detecting circuit 92 and maximum likelihood address discriminating means 93. The all "0" detecting circuit 92 detects the state metric in which all of three bits are set to 0. The address of the state metric in which all of three bits are set to 0 is detected by the maximum likelihood address detecting means 93. Thus, the address of the maximum likelihood state metric among the respective state metrics is obtained.

The state metric pair maximum likelihood detecting means 12 comprises system selecting means 94, pair metric maximum likelihood detecting means 95, and address detecting means 96. The address detecting means 96 detects whether the address to which the state metric in which all of three bits are set to 0 belongs to the series to calculate the preceding state metric and the branch metric BM00 or BM11 or belongs to the series to calculate the preceding state metric and the branch metric BM01 or BM10. An output of the address detecting means 96 is supplied to the system selecting means 94. The system in which the maximum likelihood value is not set to 0 is selected by the system selecting means 94. The state metric which belongs to the selected system is supplied to the pair metric maximum likelihood value detecting means 95. The maximum likelihood state metric among the state metrics which belong to the selected system is detected by the pair metric maximum likelihood value detecting means 95.

According to the embodiments, since the normalization of the metrics can be executed without using the result of the ACS calculation, the surviving loop can be immediately selected by the ACS calculating means and the processing time can be reduced.

On the other hand, since the normalization can be executed by the present maximum likelihood state metric, the maximum likelihood value of the state metrics is set to 0. A construction of the maximum likelihood deciding means and state metric pair maximum likelihood detecting means can be simplified and the circuit scale can be reduced. Since the normalization of the metrics can be executed before the ACS calculation, even if the number of states is large as well, the normalizing circuit does not become complicated.

Further, since the normalization of the metrics is executed every step, the state metric after completion of the ACS calculation is compressed, for instance, from seven bits to three bits and the maximum likelihood can be decided. Thus, the hardware can be simplified.

As mentioned above, the Viterbi decoder needs ACS circuits of the number of corresponding to the number of states as the ACS calculating means 3. The number of states increases like an exponential function in dependence on a restriction length. For instance, when the restriction length is set to 7, the number of states is set to 64. Therefore, if the ACS calculating means 3 is constructed by the ACS circuits as many as the number of states, a circuit scale remarkably increases.

Therefore, hitherto, there has been used a method of reducing the circuit scale of the ACS calculating means 3 by executing the time sharing processes. For instance, by executing the 16-multiplexing process, when the number of states is set to 64, the ACS calculations of 16 steps can be executed by a single ACS circuit. The ACS calculating means 3 of 64 states can be constructed by four ACS circuits.

In the case of executing the ACS calculations by the time sharing processes as mentioned above, hitherto, the time sharing processes are executed in accordance with the sequence of the state metric transition diagram. In this case, the series of the state metric outut from each ACS circuit of the ACS calculating means 3 is not fixed. Therefore, the maximum likelihood detection of the state metric pair must be executed after the state metrics obtained by the ACS calculating means are rearranged evey series. As a result, the processings become complicated and the circuit scale increases.

The ACS calculating means 3 is constructed so as to execute, for instance, a 16-division multiplexing process. Results of the calculations which are output from the ACS circuits are combined every series. Due to this, the maximum likelihood state metric pair can be easily detected.

Figure 16:
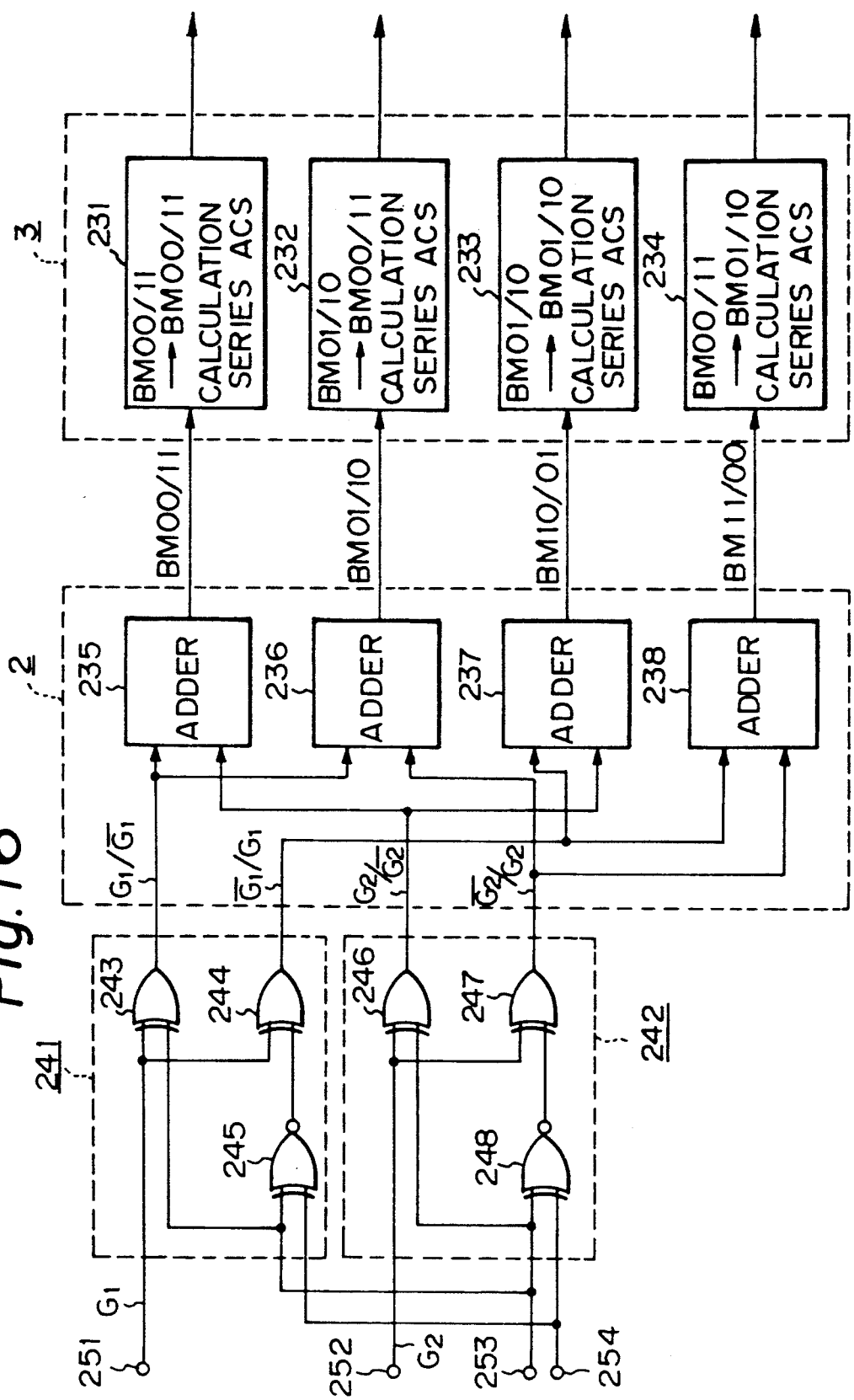
FIG. 16 is a block diagram of an example of branch metric calculating means and ACS calculating means capable of further reducing the circuit scale in an embodiment of the invention.

FIG. 16 shows a construction of the branch metric calculating means 2 and ACS calculating means 3 of the Viterbi decoder the circuit scale of which is reduced.

The branch metric calculating means 2 has four adders 235 to 238. Code contollers 241 and 242 are provided at the front stage of the branch metric calculating means 2. The reception code is controlled by the code contollers 241 and 242 in correspondence to the multplexing process of the ACS calculation and the punctured coding. An input terminal 251 of the reception code $G_1$ is led out from the code controller 241. An input terminal 252 of the reception code $G_2$ is led out from the code contoller 242. On the other hand, an input terminal 253 of a multiplex control signal and an input terminal 254 of a metric calculation inhibition signal are provided.

The code contoller 241 comprises EX-OR gates 243 and 244 and an EX-NOR gate 245. The code contoller 242 comprises EX-OR gates 246 and 247 and an EX-NOR gate 248.

The codes of the reception code $G_1$ which are output from the EX-OR gates 243 and 244 and the codes of the reception code G, which are output from the EX-OR gates 246 and 247 are controlled by the multiplex control signal from the input terminal 253.

That is, when the metric calculation inhibition signal is set to the low level and the multiplex control signal is set to the low level, the code $G_1$ is output from the EX-OR gate 243, the code $G_1$ is output from the EX-OR gate 244, the code $G_2$ is output from the EX-OR gate 246, and the code $\overline{G_2}$ is output from the EX-OR gate 247. When the metric calculation inhibition signal is set to the low level and the multiplex control signal is set to the high level, the code $\overline{G_1}$ is output from the EX-OR gate 243, the code $G_1$ is output from the EX-OR gate 244, the code $\overline{G_2}$ is output from the EX-OR gate 246, and the code $G_2$ is output from the EX-OR gate 247.

In the case of inhibiting the metric calculation upon punctured coding, the metric calculation inhibition signal from the input terminal 254 is set to the high level.

The output $G_1$ or $\overline{G_1}$ of the EX-OR gate 243 and the output $G_2$ or $\overline{G_2}$ of the EX-OR gate 246 are supplied to the adder 235. In the adder 235, $(G_1+G_2)$ or $(\overline{G_1}+\overline{G_2})$ is obtained and the branch metric BM00 or BM11 is obtained.

The output $G_1$ or $\overline{G_1}$ of the EX-OR gate 243 and the output $\overline{G_2}$ or $G_2$ of the EX-OR gate 247 are supplied to the adder 236. In the adder 236, $(G_1+\overline{G_2})$ or $(\overline{G_1}+G_2)$ is obtained and the branch metric BM01 or BM10 is obtained.

The output $\overline{G_1}$ or $G_1$ of the EX-OR gate 244 and the output $G_2$ or $\overline{G_2}$ of the EX-OR gate 246 are supplied to the adder 237. In the adder 237, $(\overline{G_1}+G_2)$ or $(G_1+\overline{G_2})$ is obtained and the branch metric BM10 or BM01 is obtained.

The output $\overline{G_1}$ or $G_1$ of the EX-OR gate 244 and the output $\overline{G_2}$ or $G_2$ of the EX-OR gate 247 are supplied to the adder 238. In the adder 238, $(\overline{G_1}+\overline{G_2})$ or $(G_1+G_2)$ is obtained and the branch metric BM11 or BM00 is obtained.

The branch metrics BM00, BM01, BM10, and BM11 indicate the likelihoods in which the reception codes are the codes (00), (01), (10) and (11), respectively.

As will be understood from the state metric transition diagrams shown in FIGS. 10A to 10E, the transitions include: a calculation series (BM00/11 →BM00/11 series) in which the ACS calculation is executed with the branch metric BM00 or BM11 and the result becomes a series to calculate the preceding state metric and the branch metric BM00 or BM11; a calculation series (BM01/10→BM00/11 series) in which the ACS calculation is executed with the branch metric BM01 or BM10 and result becomes a series to calculate the preceding state metric and the branch metric BM00 or BM11; a calculation series (BM01/10→BM01/10 series) in which the ACS calculation is executed with the branch metric BM01 or BM10 and result becomes a series to calculate the preceding state metric and the branch metric BM01 or BM10; and a calculation series (BM00/11→BM01/10 series) in which the ACS calculation is executed with the branch metric BM00 or BM11 and the result becomes a series to calculate the preceding state metric and the branch metric BM01 or BM10.

An ACS circuit 231 executes the ACS calculation of (BM00/11→BM00/11 series). That is, the ACS circuit 231 executes the ACS calculation with the branch metric BM00 or BM11 and outputs a state metric in which the result of the ACS calculation belongs to the series to calculate the preceding state metric and the branch metric BM00 or BM11.

An ACS circuit 232 executes the ACS calculation of (BM01/10→BM00/11 series). That is, the ACS calculation is executed with the branch metric BM01 or BM10, so that a state metric which belongs to the series to calculate the preceding state metric and the branch metric BM00 or BM11 is output.

An ACS circuit 233 executes the ACS calculation of (BM01/10→BM01/10 series). That is, the ACS circuit 233 executes the ACS calculation with the branch metric BM01 or BM10, so that the ACS circuit 233 outputs a state metric which belongs to the series to calculate the preceding state metric and the branch metric BM01 or BM10.

An ACS circuit 234 executes the ACS calculation of (BM00/11→BM01/10 series). That is, the ACS circuit 234 executes the ACS calculation with the branch metric BM00 or BM11, so that the ACS circuit outputs a state metric which belongs to the series to calculate the preceding state metric and the branch metric BM01 or BM10.

FIGS. 17A to 17D shows an example of the order of the ACS calculations which are executed by the ACS circuits 231 to 234.

FIG. 17A shows the operation of the ACS circuit 231. FIG. 17B shows the operation of the ACS circuit 232. FIG. 17C shows the operation of the ACS circuit 233. FIG. 17D shows the operation of the ACS circuit 234. In the example, the ACS calculations in which the number of state is set to 64 are executed in sixteen steps by using the four ACS circuits 231 to 234. FIGS. 17A to 17D show input branch metrics, input state metrics, and output state metrics.

As shown in FIG. 17A, state metrics SM'00, SM'04, SM'22, SM'3F, . . . are output from the ACS circuit 231. As shown in FIG. 17B, state metrics SM'02, SM'06, SM'20, SM'3D, . . . are output from the ACS circuit 232. As will be understood from FIGS. 10A to 10D, the state metrics which are output from the ACS circuits 231 and 232 belong to the series to calculate the preceding state metric and the branch metric BM00 or BM11. Threrefore, maximum likelihood pair state metrics are obtained from the maximum likelihood values of outputs of the ACS circuits 231 and 232.

As shown in FIG. 17C, state metrics SM'03, SM'07, SM'21, SM'3C, . . . are output from the ACS circuit 233. On the other hand, as shown in FIG. 17D, state metrics SM'01, SM'05, SM'23, SM'3E, . . . are output from the ACS circuit 234. As will be understood from FIGS. 10A to 10D, the state metrics which are output from the ACS circuits 233 and 234 belong to the series to calculate the preceding state metric and the branch metric BM01 or BM10. Threrefore, the other maximum likelihood pair state metrics are obtained from the maximum likelihood values of outputs of the ACS circuits 233 and 234.

As mentioned above, by executing the ACS calculations by the time sharing processes so as to combine the state metrics every series, when the maximum likelihood state metric pairs are detected, a rearranging process is unnecessary and the maximum likelihood state mertic pairs can be easily detected.

Figure 18:
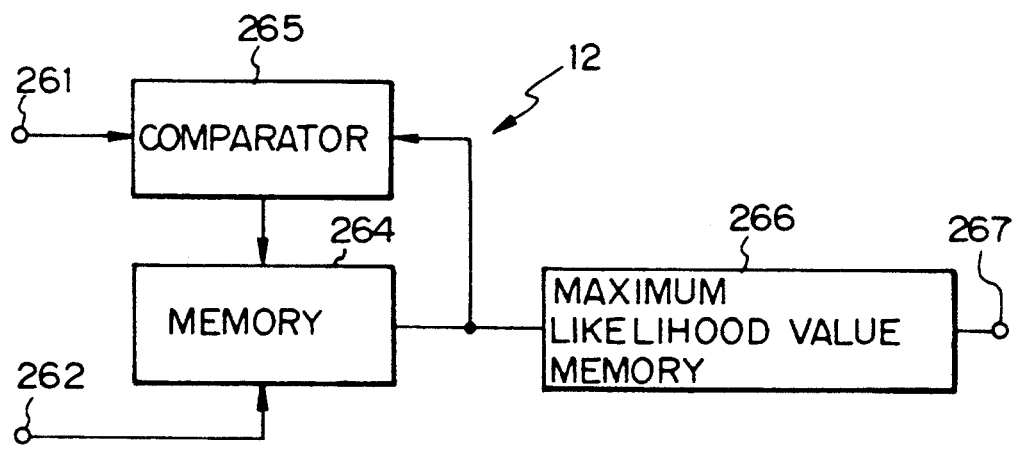
FIG. 18 is a block diagram which is used to explain still another embodiment of the invention.

That is, in FIG. 18, an initial value is first given from an input terminal 262 to a memory 264. After that, the maximum likelihood values of the state metrics which were obtained so far are stored.

The state metrics obtained by the ACS circuits 231 to 234 are supplied from an input terminal 261 to a comparator 265. An output of the memory 264 is supplied to the comparator 265. The comparator 265 compares the state metric from the input terminal 261 and the maximum likelihood value of the state metrics which have been stored so far in the memory 264.

If the likelihood degree of the maximum likelihood value of the state metrics stored so far in the memory 264 is higher than that of the state metric from the input terminal 261, the state metrics in the memory 264 are held as they are.

If the likelihood degree of the state metric from the input terminal 261 is higher than those of the maximum likelihood values of the state metrics stored so far in the memory 264, the state metrics in the memory 264 are rewritten to the state metric from the input terminal 261.

By repeating the above process, the maximum likelihood state metric is stored into the memory 264.

After completion of predetermined steps, the state metrics stored in the memory 264 are stored into a maximum likelihood value memory circuit 266. The maximum likelihood state metric of the series is output from an output terminal 267.

In the above example, the 16-multiplexing process has been executed. However, even in the case of executing the 4-multiplexing process or 8-multiplexing process, the ACS calculations can be also executed by the time sharing processes so as to combine every series.

According to this embodiment, since the ACS calculation is executed by the time sharing processes so as to combine evey series, the maximum likelihood state metric pair can be easily detected.

Further, by providing the code controllers each for controlling the code of the reception code on the basis of a multiplex control signal, which can be constructed by a simple gate circuit, at the front stage of the branch metric calculating means, in the case of time sharingly processing the ACS calculations, a construction of the branch metric calculating means can be simplified.

On the other hand, by using the code controllers, in the case where the punctured coding was executed, a metric calculation inhibiting function can be provided.

What is claimed is:

1. A Viterbi decoder for decoding a convolution code comprising:
    branch metric calculating means for calculating a branch metric of an input signal;
    ACS calculating means for selecting a surviving path and calculating a state metric;
    branch metric pair detecting means connected to an output of the branch metric calculating means for receiving branch metrics from the branch metric calculating means and detecting a maximum likelihood branch metric pair before ACS calculation from said branch metrics from the branch metric calculating means;
    state metric pair detecting means for receiving state metrics from the ACS calculating means and detecting a preceding maximum likelihood state metric pair from said state metrics;
    maximum likelihood value detecting means connected to an output of the branch metric pair detecting means, for receiving the preceding maximum likelihood state metric pair, and detecting a maximum likelihood value of a present state metric from the maximum likelihood branch metric pair before the ACS calculation and the preceding maximum likelihood state metric pair, and a metric normalization means, connected to an output of the maximum likelihood value detecting means, for normalizing metrics by using a maximum likelihood value obtained by said maximum likelihood value detecting means.

2. A Viterbi decoder according to claim 1, further comprising state metric memory means for storing the state metric output from said ACS calculating means and supplying the preceding state metric to said ACS calculating means.

3. A Viterbi decoder according to claim 1, further comprising state metric memory means for storing the state metric output from said ACS calculating means and supplying the preceding state metric to said ACS calculating means, wherein an input of said state metric memory means is connected to said state metric pair detecting means.

4. A Viterbi decoder according to claim 1, wherein said ACS calculating means has at least one ACS circuit comprising an adder, a comparator and a selector and the ACS calculation is executed by time sharingly operating the ACS circuit.

5. A Viterbi decoder according to claim 4, wherein the ACS calculation is executed by time sharing processes so that the ACS calculating means outputs state metric pairs which combine every series.

6. A Viterbi decoder according to claim 4, said branch metric calculating means comprising:
   code control means for controlling a code of the input signal on the basis of a multiplex control signal; and
   an adder for obtaining each branch metric by adding outputs of the code control means.

7. A Viterbi decoder for decoding a convolution code comprising:
   branch metric calculating means for calculating a branch metric of an input signal;
   ACS calculating means for selecting a surviving path and calculating a state metric;
   branch metric pair detecting means connected to an output of the branch metric calculating means for receiving branch metrics from the branch metric calculating means and detecting a maximum likelihood branch metric pair before ACS calculation from said branch metrics from the branch metric calculating means;
   state metric pair detecting means for receiving state metrics after ACS calculation and detecting a preceding maximum likelihood state metric pair from said state metrics;
   maximum likelihood value detecting means connected to an output of the branch metric pair detecting means and to an output of the state metric pair detecting means, for receiving the preceding maximum likelihood state metric pair, and detecting a maximum likelihood value of a present state metric from the maximum likelihood branch metric pair and the preceding maximum likelihood state metric pair; and
   a metric normalization means, connected to an output of the maximum likelihood value detecting means, for normalizing metrics after the ACS calculation by using the maximum likelihood value detected by said maximum likelihood value detecting means.

* * * * *